(12) United States Patent
Wakamatsu et al.

(10) Patent No.: US 11,320,739 B2
(45) Date of Patent: May 3, 2022

(54) COMPOSITION FOR RESIST UNDERLAYER FILM FORMATION, RESIST UNDERLAYER FILM AND METHOD FOR PRODUCING PATTERNED SUBSTRATE

(71) Applicant: JSR CORPORATION, Tokyo (JP)

(72) Inventors: Goji Wakamatsu, Tokyo (JP); Naoya Nosaka, Tokyo (JP); Tsubasa Abe, Tokyo (JP); Kazunori Sakai, Tokyo (JP); Yuushi Matsumura, Tokyo (JP); Hayato Namai, Tokyo (JP)

(73) Assignee: JSR CORPORATION, Tokyo (JP)

( * ) Notice: Subject to any disclaimer, the term of this patent is extended or adjusted under 35 U.S.C. 154(b) by 105 days.

(21) Appl. No.: 16/100,501

(22) Filed: Aug. 10, 2018

(65) Prior Publication Data

US 2018/0348633 A1 Dec. 6, 2018

Related U.S. Application Data

(63) Continuation of application No. PCT/JP2017/001616, filed on Jan. 18, 2017.

(30) Foreign Application Priority Data

Feb. 15, 2016 (JP) .............................. JP2016-026408

(51) Int. Cl.
G03F 7/40 (2006.01)
G03F 7/30 (2006.01)
G03F 7/09 (2006.01)
G03F 7/11 (2006.01)
H01L 21/027 (2006.01)
G03F 7/26 (2006.01)
G03F 7/039 (2006.01)

(52) U.S. Cl.
CPC ............... *G03F 7/40* (2013.01); *G03F 7/039* (2013.01); *G03F 7/091* (2013.01); *G03F 7/11* (2013.01); *G03F 7/26* (2013.01); *G03F 7/30* (2013.01); *H01L 21/0271* (2013.01)

(58) Field of Classification Search
CPC ..... G03F 7/36; G03F 7/11; G03F 7/40; G03F 7/30; G03F 7/091
See application file for complete search history.

(56) References Cited

U.S. PATENT DOCUMENTS

| 5,723,254 A * | 3/1998 | Zampini | ................. C08G 8/28 430/190 |
| 2005/0074695 A1 | 4/2005 | Nakamura et al. | |
| 2012/0045900 A1 * | 2/2012 | Watanabe | .................. G03F 7/11 438/703 |
| 2012/0171611 A1 * | 7/2012 | Ideno | ..................... C08G 61/02 430/270.1 |
| 2012/0252218 A1 * | 10/2012 | Kori | ..................... C09D 161/12 438/703 |
| 2013/0004894 A1 * | 1/2013 | Hayashi | .................. G03F 7/091 430/281.1 |
| 2014/0363956 A1 * | 12/2014 | Hatakeyama | ............. C08G 8/04 438/514 |
| 2018/0052392 A1 * | 2/2018 | Okada | ................. H01L 21/0276 |

FOREIGN PATENT DOCUMENTS

| JP | H5-238990 A | 9/1993 |
| JP | 2003-330199 A | 11/2003 |
| JP | 2004-177668 A | 6/2004 |
| JP | 2004-310019 A | 11/2004 |
| JP | 2010-519361 A | 6/2010 |
| JP | 2012-518812 A | 8/2012 |
| JP | 2013-97002 A | 5/2013 |
| JP | 2014-037386 A | 2/2014 |
| JP | 2015-200796 A | 11/2015 |
| TW | 200906989 A | 2/2009 |
| TW | 201035690 A1 | 10/2010 |
| TW | 201321894 A1 | 6/2013 |

OTHER PUBLICATIONS

International Search Report dated Apr. 4, 2017, in PCT Application. No. PCT/JP2017/001616, (w/ English translation).
Written Opinion dated Apr. 4, 2017, in PCT Application. No. PCT/JP2017/001616, (w/English translation).
Qun-Sheng Guo, et al., "A facile synthesis of 3 or 3,3'-substituted binaphthols and their applications in the asymmetric addition of diethylzinc to aldehydes", Journal of Organometallic Chemistry, 2006, vol. 691, pp. 1282-1287.
Yasmeen Badar, et al., "Optical Activity in the 1,1'-Binaphthyl Series. Optically Active 8,8'-Dimethyl-1,1'-binaphthyl.", Journal of the Chemical Society, 1965, pp. 1412-1418.
Jen-Chieh Hsieh, et al. "O-Dihaloarenes as aryne precursors for nickel-catalyzed [2 +2+2] cycloaddition with alkynes and nitriles", Chemical Communications, Cambridge, United Kingdom, 2008, pp. 2992-2994.
R.G.R. Bacon, et al., "Cyclisations with Hydrazine. Part III. Syntheses of Pentaphene and Dinaphtho[2,1-d: 1',2'-f ] [1,2]diazocine." Journal of the Chemical Society,1963, pp. 839-845.
Katsuhisa Mizoguchi, et al., "Negative-Working Photosensitive Poly(phenylene ether) Based on Poly(2,6-dimethyl-1,4-phenylene ether), a Cross-Linker, and a Photoacid Generator", Macromolecules, 2010, vol. 43, pp. 2832-2839.

(Continued)

*Primary Examiner* — John S Chu
(74) *Attorney, Agent, or Firm* — Oblon, McClelland, Maier & Neustadt, L.L.P.

(57) ABSTRACT

A composition for resist underlayer film formation, includes a first compound and a solvent. The first compound includes a first group represented by formula (1) and a partial structure comprising an aromatic ring. In the formula (1), $R^1$ represents a single bond or an oxygen atom, $R^2$ represents a divalent chain or alicyclic hydrocarbon group having 1 to 30 carbon atoms, and * denotes a bonding site to a moiety other than the first group of the first compound.

$$*-R^1-R^2-CN \qquad (1)$$

20 Claims, No Drawings

(56) References Cited

OTHER PUBLICATIONS

Katsuhisa Mizoguchi, et al., "Direct Patterning of Poly(ether ether sulfone) Using a Cross-linker and a Photoacid Generator", Polymer Journal, 2008, vol. 40, No. 7, pp. 645-650.
Katsuhisa Mizoguchi, et al., "Negative-Type Photosensitive Poly(phenylene ether) Based on Poly(2,6-dimethyl-1,4-phenylene ether), a Crosslinker, and a Photoacid Generator", Journal of Polymer Science: Part A, Polymer Chemistry, 2008, vol. 46, pp. 4949-4958.
Japanese Office Action dated Apr. 28, 2020 in Patent Application No. 2017-567994 (with machine-generated English translation), 6 pages.
Taiwanese Office Action dated Jul. 17, 2020 in Taiwanese Patent Application No. 106104041 (with English translation), 10 pages.
Japanese Office Action dated Dec. 1, 2020 in Japanese Patent Application No. 2017-567994 (unedited computer generated English translation), 5 pages.
Office Action dated Jun. 1, 2021 in corresponding Japanese Patent Application No. 2017-567994 (with English-language Translation), 4 pages.
Combined Taiwanese Office Action and Search Report dated Feb. 22, 2021 in Patent Application No. 106104041 (with English language translation), 27 pages.

\* cited by examiner

COMPOSITION FOR RESIST UNDERLAYER FILM FORMATION, RESIST UNDERLAYER FILM AND METHOD FOR PRODUCING PATTERNED SUBSTRATE

CROSS-REFERENCE TO RELATED APPLICATIONS

The present application is a continuation application of International Application No. PCT/JP2017/001616, filed Jan. 18, 2017, which claims priority to Japanese Patent Application No. 2016-026408, filed Feb. 15, 2016. The contents of these applications are incorporated herein by reference in their entirety.

BACKGROUND OF THE INVENTION

Field of the Invention

The present invention relates to a composition for resist underlayer film formation, a resist underlayer film and a method for producing a patterned substrate.

Discussion of the Background

In the manufacture of semiconductor devices, multilayer resist processes have been employed for attaining a high degree of integration. In such a process, a composition for resist underlayer film formation is applied on one face side of a substrate to form a resist underlayer film, and then a resist composition is applied to form a resist film. Then, the resist film is exposed through, for example, a mask pattern, and is developed with a developer solution to form a resist pattern. Subsequently, the resist underlayer film is dry-etched using the resist pattern as a mask, and the substrate is further etched using the resulting resist underlayer film pattern as a mask, whereby a desired pattern is formed on the substrate. In this way, a patterned substrate can be obtained.

Various investigations have been made on a resin and the like contained in the composition for resist underlayer formation with respect to the structure and functional groups which may be included in the resin or the like (see Japanese Unexamined Patent Application, Publication No. 2004-177668).

There has been a growing trend in recent years to form a pattern on a substrate having different types of trenches, in particular, trenches having different aspect ratios. With this trend, a resist underlayer film is required to favorably fit in the trenches and to have enhanced flatness.

SUMMARY OF THE INVENTION

According to one aspect of the present invention, a composition for resist underlayer film formation, includes a first compound and a solvent. The first compound includes a first group represented by formula (1) and a partial structure comprising an aromatic ring.

In the formula (1), $R^1$ represents a single bond or an oxygen atom, $R^2$ represents a divalent chain or alicyclic hydrocarbon group having 1 to 30 carbon atoms, and * denotes a bonding site to a moiety other than the first group of the first compound.

According to another aspect of the present invention, a resist underlayer film is formed from the composition.

According to further aspect of the present invention, a method for producing a patterned substrate includes forming a resist underlayer film from the composition directly or indirectly on an upper face side of a substrate. A resist pattern is formed directly or indirectly on an upper face side of the resist underlayer film. A pattern is formed on the substrate by etching the substrate a plurality of times using the resist pattern as a mask.

DESCRIPTION OF EMBODIMENTS

According to one embodiment of the invention, a composition for resist underlayer film formation contains: a first compound (hereinafter, may be also referred to as "(A) compound" or "compound (A)") that includes a first group (hereinafter, may be also referred to as "group (I)") represented by the following formula (1) and a partial structure including an aromatic ring; and a solvent (hereinafter, may be also referred to as "(B) solvent" or "solvent (B)").

In the formula (1), $R^1$ represents a single bond or an oxygen atom; $R^2$ represents a divalent chain or alicyclic hydrocarbon group having 1 to 30 carbon atoms; and * denotes a bonding site to a moiety other than the group (I) of the compound (A).

According to another embodiment of the invention, a resist underlayer film is formed from the composition for underlayer film formation according to the one aspect of the invention.

According to still another embodiment of the present invention, a method for producing a patterned substrate includes: forming a resist underlayer film directly or indirectly on an upper face side of a substrate; forming a resist pattern directly or indirectly on an upper face side of the resist underlayer film; and forming a pattern on the substrate by etching the substrate a plurality of times using the resist pattern as a mask. The resist underlayer film is formed from the composition for resist underlayer formation according to the one embodiment of the present invention.

The composition for resist underlayer film formation according to the one embodiment of the present invention enables the formation of a resist underlayer film superior in flatness as well as in solvent resistance, etching resistance and heat resistance. In addition, the composition for resist underlayer film formation is superior in storage stability.

The resist underlayer film according to the another embodiment of the present invention is superior in flatness as well as in solvent resistance, etching resistance and heat resistance.

The method for producing a patterned substrate according to the still another embodiment of the present invention enables the formation of a patterned substrate having a superior pattern configuration through the use of the resist underlayer film which was thus formed and has superior characteristics.

Therefore, these can be suitably used for the manufacture of semiconductor devices and the like in which further progress of miniaturization is expected in the future. Hereinafter, the embodiments of the present invention will be explained in detail.

Composition for Resist Underlayer Film Formation

A composition for resist underlayer film formation according to an embodiment of the present invention contains the compound (A) and the solvent (B). The composition for resist underlayer film formation may contain as a favorable component, (C) an acid generating agent (hereinafter, may be also referred to as "acid generating agent (C)") and/or (D) a crosslinking agent (hereinafter, may be also referred to as "crosslinking agent (D)"), and may also contain other optional component within a range not leading to impairment of the effects of the present invention. Each component will be described below.

(A) Compound

The compound (A) includes a group (I) and a partial structure including an aromatic ring. The compound (A) is not particularly limited as long as it includes the group (I) and an aromatic ring. The compound (A) may be used either alone of one type, or in combination of two or more types thereof.

Group (I)

The group (I) is represented by the following formula (1).

*—R$^1$—R$^2$—CN    (1)

In the formula (1), R$^1$ represents a single bond or an oxygen atom; R$^2$ represents a divalent chain or alicyclic hydrocarbon group having 1 to 30 carbon atoms; and * denotes a bonding site to a moiety other than the group (I) of the compound (A).

R$^2$ represents a divalent chain or alicyclic hydrocarbon group having 1 to 30 carbon atoms. The divalent chain hydrocarbon group having 1 to 30 carbon atoms is exemplified by an alkanediyl group, an alkenediyl group, an alkynediyl group and the like each having 1 to 30 carbon atoms. Examples of the alkanediyl group include a methanediyl group, an ethanediyl group, a propanediyl group, a butanediyl group, a pentanediyl group, a hexanediyl group, an octanediyl group, a decanediyl group, a tetradecanediyl group, an octadecanediyl group, an icosanediyl group, and the like. Examples of the alkenediyl group include an ethenediyl group, a propenediyl group, a butenediyl group, and the like. Examples of the alkynediyl group include an ethynediyl group, a propynediyl group, a butynediyl group, and the like.

The divalent alicyclic hydrocarbon group having 1 to 30 carbon atoms is exemplified by a cyclopentanediyl group, a cyclohexanediyl group, a norbornanediyl group, an adamantanediyl group, a cyclopentenediyl group, a cyclohexenediyl group, a norbornenediyl group, and the like.

Of these, the chain hydrocarbon group is preferred, the alkanediyl group is more preferred, the methanediyl group, the ethanediyl group, the propanediyl group and the butanediyl group are still more preferred, and the methanediyl group and the ethanediyl group are particularly preferred.

The group (I) is preferably a cyanoalkyl group or a cyanoalkyloxy group.

Examples of the cyanoalkyl group include a cyanomethyl group, a cyanoethyl group, a cyanopropyl group, a cyanobutyl group, a cyanopentyl group, a cyanohexyl group, a cyanooctyl group, a cyanodecyl group, and the like.

Examples of the cyanoalkyloxy group include a cyanomethyloxy group, a cyanoethyloxy group, a cyanopropyloxy group, a cyanobutyloxy group, a cyanopentyloxy group, a cyanohexyloxy group, a cyanooctyloxy group, a cyanodecyloxy group, and the like.

Of these, the cyanoalkyloxy group is preferred, the cyanomethyloxy group and the cyanoethyloxy group are more preferred, and the cyanomethyloxy group is particularly preferred.

The compound (A) is preferably a compound in which the group (I) is bonded to the partial structure including the aromatic ring.

Examples of the aromatic ring include:

aromatic carbon rings such as a benzene ring, a naphthalene ring, an anthracene ring, an indene ring, a pyrene ring, a fluorenylidenebiphenyl ring and a fluorenylidenebinaphthalene ring;

aromatic heterocycles such as a furan ring, a pyrrole ring, a thiophene ring, a phosphole ring, a pyrazole ring, an oxazole ring, an isoxazole ring, a thiazole ring, a pyridine ring, a pyrazine ring, a pyrimidine ring, a pyridazine ring and a triazine ring; and the like.

The lower limit of the proportion of the aromatic rings in the compound (A) is preferably 20% by mass, more preferably 30% by mass, and still more preferably 40% by mass. The upper limit of the proportion of the aromatic rings is preferably 90% by mass, more preferably 85% by mass, and still more preferably 80% by mass. When the proportion of the aromatic rings in the compound (A) falls within the above range, the solvent resistance, the etching resistance and the heat resistance of the resist underlayer film can be improved. It is to be noted that the "proportion of the aromatic rings in the compound (A)" as referred to herein means a percentage value of the total atomic weight of all of the atoms constituting the aromatic rings with respect the total atomic weight of atoms constituting the compound (A).

The compound (A) is exemplified by a resin including an aromatic ring in the main chain thereof, a resin including no aromatic ring in the main chain thereof and including an aromatic ring in a side chain thereof, an aromatic ring-containing compound having a molecular weight of no less than 200 and no greater than 3,000, and the like. The "main chain" as referred to herein means the longest of all atom chains in the compound (A). The "side chain" as referred to herein means an atom chain other than the longest of all atom chains in the compound (A). The "aromatic ring-containing compound" as referred to herein means a compound that is not either of the above-mentioned resins and includes an aromatic ring.

Examples of the resin include polycondensation resins such as a novolac resin and a resol resin, resins obtained by a reaction other than polycondensation such as an aromatic ring-containing vinyl resin, an acenaphthylene resin, an indene resin, a polyarylene resin, a triazine resin, a pyrene resin, a fullerene resin and a calixarene resin, and the like. These resins will be described below. It is to be noted that the "molecular weight" of the resin referred to above means the weight average molecular weight (Mw), which is the polystyrene equivalent weight average molecular weight as determined by gel permeation chromatography (GPC).

Novolac Resin

The novolac resin includes the group (I) and has a structure derived from a compound obtained by allowing a phenol compound to react with an aldehyde compound, a divinyl compound or the like using an acidic catalyst.

Examples of the phenol compound include:

phenols such as phenol, cresol, xylenol, resorcinol, bisphenol A, p-tert-butylphenol, p-octylphenol and 9,9-bis(4-hydroxyphenyl)fluorene;

naphthols such as α-naphthol, β-naphthol, 1,5-dihydroxynaphthalene, 2,7-dihydroxynaphthalene and 9,9-bis(6-hydroxynaphthyl)fluorene;

anthrols such as 9-anthrol; and the like.

Examples of the aldehyde compound include: aldehydes such as formaldehyde;

aldehyde sources such as paraformaldehyde and trioxane; and the like.

Examples of the divinyl compound include divinylbenzene, dicyclopentadiene, tetrahydroindene, 4-vinylcyclohexene, 5-vinylnorborna-2-ene, divinylpyrene, limonene, 5-vinylnorbornadiene, and the like.

Specific examples of the novolac resin include resins having a structural unit represented by the following formula, and the like.

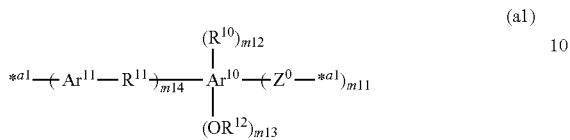

(a1)

In the above formula (a1), $Ar^{10}$ represents an aromatic group having a valency of $(m_{11}+m_{12}+m_{13}+1)$; $R^{10}$ represents a monovalent hydrocarbon group having 1 to 10 carbon atoms, or a monovalent group obtained by combining —CO—, —COO—, —OCO—, —O—, —CS—, —S—, —SO—, —SO$_2$—, —NR$^{a1}$— or a combination thereof with a monovalent hydrocarbon group having 1 to 10 carbon atoms, wherein $R^{a1}$ represents a hydrogen atom or a hydrocarbon group having 1 to 10 carbon atoms; $Ar^{11}$ represents a single bond or a divalent aromatic group; $R^{11}$ represents a single bond, a divalent hydrocarbon group having 1 to 10 carbon atoms, —CO—, —COO—, —OCO—, —O—, —CS—, —S—, —SO—, —SO$_2$—, —NR$^{a1}$—, or a divalent group obtained by combining these groups, wherein $R^{a1'}$ represents a hydrogen atom or a hydrocarbon group having 1 to 10 carbon atoms; $R^{12}$ represents a hydrogen atom or the group (I) (where $R^1$ represents a single bond), wherein at least one of a plurality of $R^{12}$s represents the group (I); $Z^0$ represents a single bond, a divalent hydrocarbon group having 1 to 10 carbon atoms, —CO—, —COO—, —OCO—, —O—, —CS—, —S—, —SO—, —SO$_2$—, —NR$^{a1'}$—, or a divalent group obtained by combining these groups, wherein $R^{a1'}$ represents a hydrogen atom or a hydrocarbon group having 1 to 10 carbon atoms; $m_1$ represents the number of $Z^0$s bonded to $Ar^{10}$, and is an integer of 1 to 6; $m_{12}$ is an integer of 0 to 6; $m_{13}$ is an integer of 1 to 6; $m_{14}$ is an integer of 0 to 2, wherein in a case in which $R^{10}$, $Ar^{11}$, $R^{11}$, $R^{12}$ and $Z^0$ are each present in a plurality of number, a plurality of $R^{10}$s may be identical or different, a plurality of $Ar^{11}$s may be identical or different, a plurality of $R^{11}$s may be identical or different, a plurality of $R^{12}$s may be identical or different, and a plurality of $Z^0$s may be identical or different; and *$^{a1}$ represents an atomic bonding.

Specific examples of the novolac resin include resins having structural units represented by the following formulae, and the like.

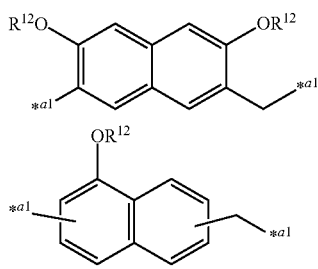

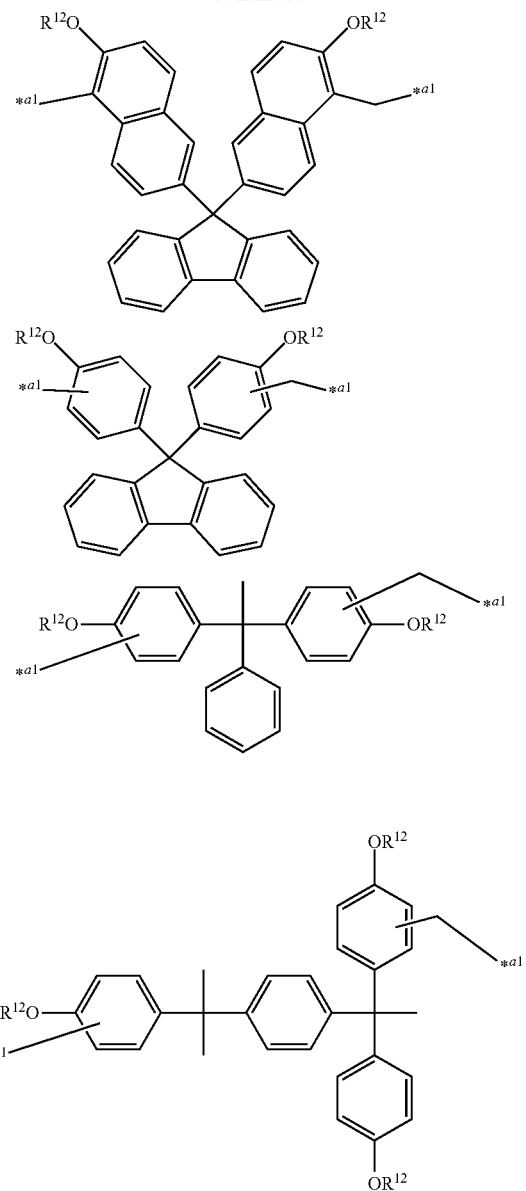

In the above formulae, $R^{12}$ represents a hydrogen atom or the group (I) (where $R^1$ represents a single bond), wherein at least one of a plurality of $R^{12}$s represents the group (I); and *$^{a1}$ is as defined in the above formula (a1).

Resol Resin

The resol resin includes the group (I) and has a structure derived from a compound obtained by allowing a phenol compound to react with an aldehyde compound using an alkaline catalyst.

Aromatic Ring-Containing Vinyl Resin

The aromatic ring-containing vinyl resin includes the group (I) and has a structural unit derived from a compound including an aromatic ring and a polymerizable carbon-carbon double bond.

Examples of the aromatic ring-containing vinyl resin include resins having a structural unit represented by the following formula (a2), and the like.

(a2)

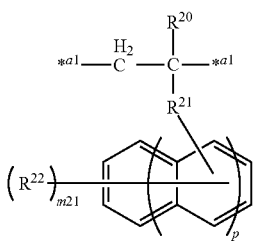

In the above formula (a2), $R^{20}$ represents a hydrogen atom or a methyl group; $R^{21}$ represents a single bond, —O—, —COO—, —CONH—, or a divalent organic group having 1 to 20 carbon atoms; $R^{22}$ each independently represents a halogen atom, a hydroxy group or the group (I); m21 is an integer of 1 to 5, wherein in a case in which m21 is no less than 2, a plurality of $R^{22}$s may be identical or different, and wherein at least one of $R^{22}$s represents the group (I); and p is an integer of 0 to 2.

The divalent organic group having 1 to 20 carbon atoms which may be represented by $R^{21}$ is exemplified by divalent chain hydrocarbon groups, e.g., alkanediyl groups such as a methanediyl group, an ethanediyl group, a propanediyl group, a butanediyl group, a pentanediyl group, a hexanediyl group, an octanediyl group, a decanediyl group, a tetradecanediyl group, an octadecanediyl group and an icosanediyl group, and the like.

$R^{21}$ represents preferably a single bond, —O—, —COO—, —CONH— or —CH$_2$—, and more preferably a single bond. $R^{22}$ represents preferably the group (I).

The aromatic ring-containing vinyl resin may also have a structural unit other than the structural unit represented by the above formula (a2). The monomer that gives the other structural unit is not particularly limited, and is exemplified by various compounds including a polymerizable carbon-carbon double bond.

Examples of the compound including a polymerizable carbon-carbon double bond include:

acrylic monomers such as (meth)acrylonitrile, (meth)acrylic acid, methyl (meth)acrylate and (meth)acrylamide;

vinyl ethers such as ethyl vinyl ether;

maleic anhydride; vinyl acetate; vinylpyridine; and the like.

In the case where the aromatic ring-containing vinyl resin has the other structural unit, the upper limit of the proportion of the other structural unit with respect to the total structural units constituting the aromatic ring-containing vinyl resin is preferably 80 mol %, and more preferably 50 mol %.

Acenaphthylene Resin

The acenaphthylene resin includes the group (I) and has a structural unit derived from a compound having an acenaphthylene skeleton.

Examples of the acenaphthylene resin include resins having a structural unit represented by the following formula (a3), and the like.

(a3)

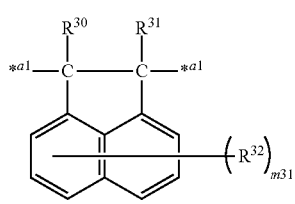

In the above formula (a3), $R^{30}$ and $R^{31}$ each independently represent a hydrogen atom, a halogen atom, a monovalent hydrocarbon group having 1 to 10 carbon atoms, or a monovalent group obtained by combining —CO—, —COO—, —OCO—, —O—, —CS—, —S—, —SO—, —SO$_2$—, —NR$^{a1}$— or a combination thereof with a monovalent hydrocarbon group having 1 to 10 carbon atoms, wherein $R^{a1}$ represents a hydrogen atom or a hydrocarbon group having 1 to 10 carbon atoms; $R^{32}$ represents a hydrogen atom, a monovalent hydrocarbon group having 1 to 12 carbon atoms, or a group including the group (I); and m31 is an integer of 1 to 6, wherein in a case in which m31 is no less than 2, a plurality of $R^{32}$s may be identical or different, and at least one of the plurality of $R^{32}$s includes the group (I).

For further improvements in the flatness and surface coating properties of the resist underlayer film, the acenaphthylene resin preferably has a structure obtained by substituting the group (I) for a hydroxy group of a copolymer of acenaphthylene and hydroxymethyl acenaphthylene.

Indene Resin

The indene resin includes the group (I) and has a structural unit derived from a compound having an indene skeleton.

Polyarylene Resin

The polyarylene resin includes the group (I) and has a structural unit derived from a compound having an arylene skeleton.

Examples of the arylene skeleton include a phenylene skeleton, a naphthylene skeleton, a biphenylene skeleton, and the like.

Triazine Resin

The triazine resin includes the group (I) and has a structural unit derived from a compound having a triazine skeleton.

Examples of the compound having a triazine skeleton include a melamine compound, a cyanuric acid compound, and the like.

Pyrene Resin

The pyrene resin includes the group (I) and has a structural unit derived from a compound including a pyrene ring.

Examples of the pyrene resin include resins each having at least one of structural units represented by the following formulae, and the like.

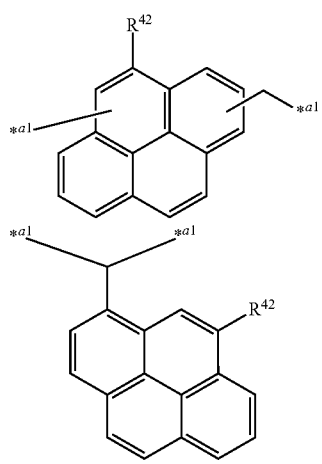

In the above formulae, $R^{42}$ represents the group (I).

Fullerene Resin

The fullerene resin has a fullerene skeleton and includes the group (I).

Examples of the fullerene resin include: a compound obtained by bonding a diazocyclohexyl group to fullerene and then bonding the group (I) to the diazocyclohexyl group; a compound obtained by bonding a hydroxy hydrocarbon group to fullerene and then substituting the hydroxy group in the hydroxy hydrocarbon group with the group (I); and the like.

Calixarene Resin

The calixarene resin has a structure obtained by substituting the group (I) (where $R^1$ represents a single bond) for a phenolic hydroxyl group of a cyclic oligomer in which a plurality of aromatic rings to which at least one hydroxy group bonds are linked in a cyclic manner via a hydrocarbon group.

The calixarene resin is exemplified by a compound represented by the following formula (2), and the like.

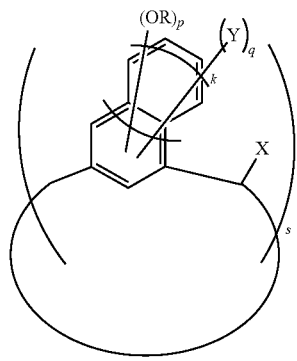

(2)

In the above formula (2), R represents a hydrogen atom, the group (I) (where $R^1$ represents a single bond) or a monovalent organic group having 1 to 30 carbon atoms other than the group (I), wherein at least one of Rs represents the group (I) (where $R^1$ represents a single bond); X represents a hydrogen atom or a substituted or unsubstituted monovalent hydrocarbon group having 1 to 30 carbon atoms; Y represents a monovalent hydrocarbon group having 1 to 10 carbon atoms; k is 0 or 1; s is an integer of 4 to 12; p is an integer of 1 to 3; and q is an integer of 0 to 5, wherein $1 \leq p+q \leq 6$.

Examples of the monovalent hydrocarbon group having 1 to 30 carbon atoms which may be represented by X include a group obtained by adding one hydrogen atom to a divalent chain or alicyclic hydrocarbon group having 1 to 30 carbon atoms which is represented by $R^2$ in the above formula (1), and the like.

Examples of the monovalent hydrocarbon group having 1 to 10 carbon atoms which may be represented by Y include a group having 1 to 10 carbon atoms and obtained by adding one hydrogen atom to a divalent chain or alicyclic hydrocarbon group having 1 to 30 carbon atoms which is represented by $R^2$ in the above formula (1), and the like.

The lower limit of s is preferably 4 and more preferably 5 and thus the composition for resist underlayer film formation can exhibit further improved coating properties on the substrate. The upper limit of s is preferably 8, more preferably 7, and still more preferably 6 and thus the resist underlayer film can have further improved flatness.

The lower limit of the Mw of the calixarene resin is preferably 500, more preferably 700, and still more preferably 1,000 and thus the resist underlayer film can have further improved flatness. The upper limit of the Mw of the calixarene resin is preferably 5,000, more preferably 3,000, and still more preferably 1,500.

Examples of the calixarene resin include compounds represented by the following formulae, and the like.

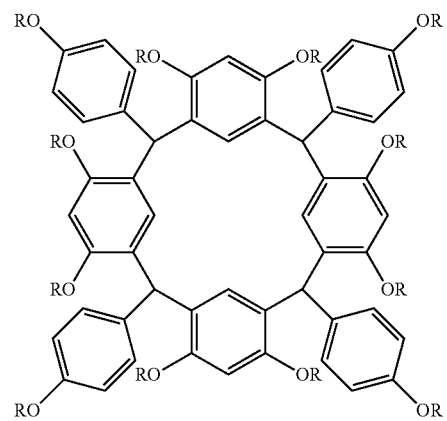

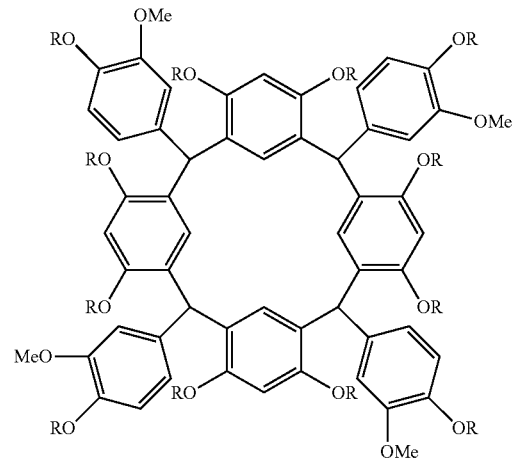

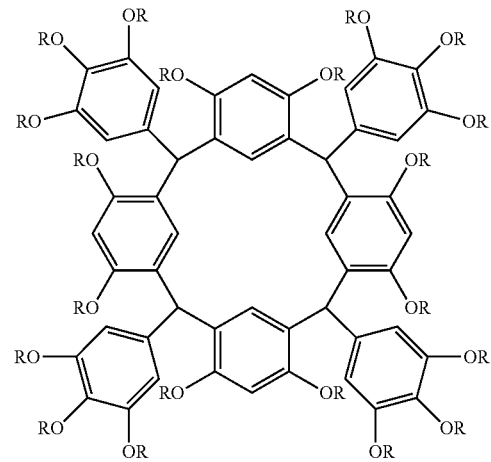

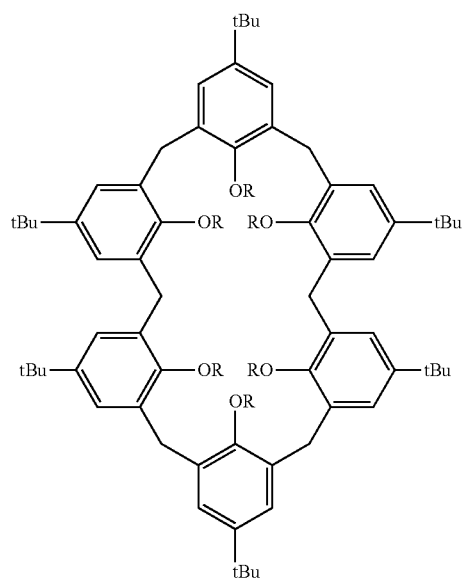
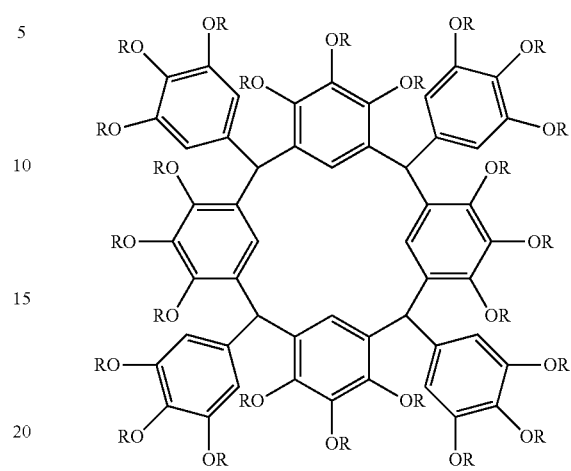
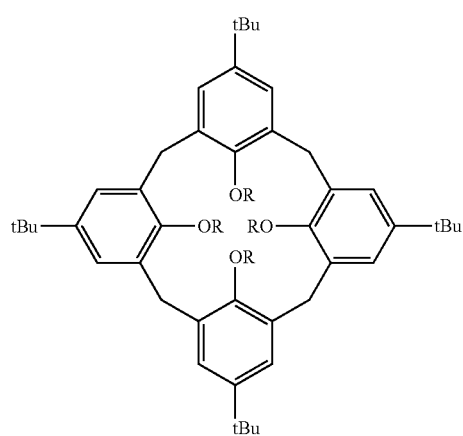
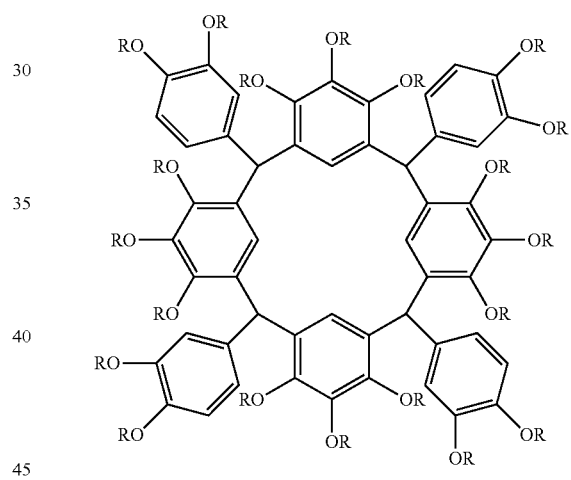
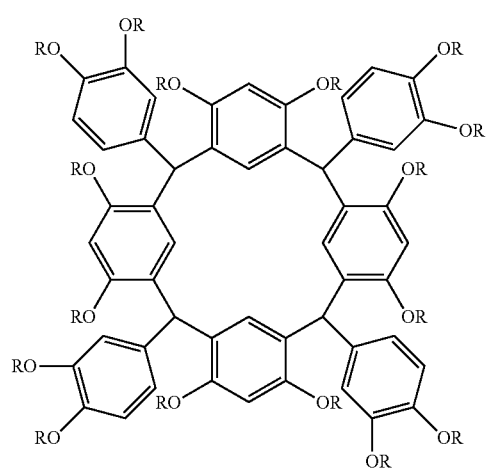
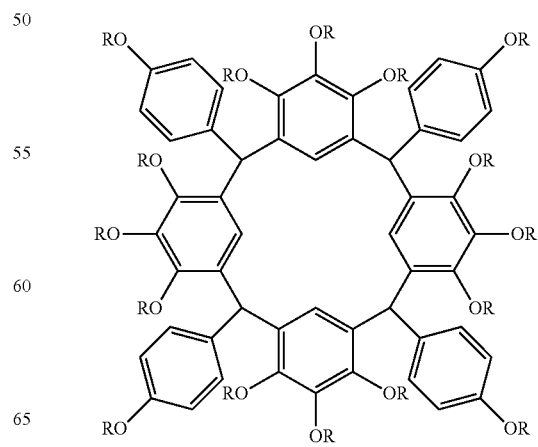

-continued

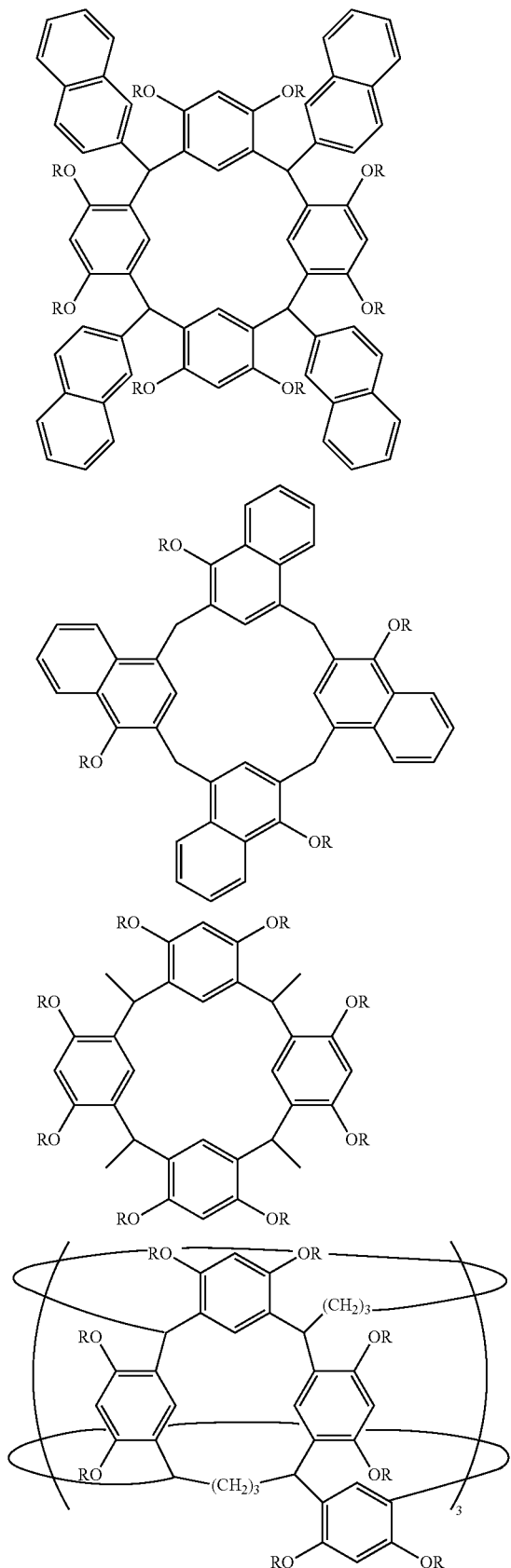

In the above formulae, R represents a hydrogen atom, the group (I) (where $R^1$ represents a single bond) or a monovalent organic group having 1 to 30 carbon atoms other than the group (I), wherein at least one of Rs represents the group (I) (where $R^1$ represents a single bond).

R represents preferably a hydrogen atom or the group (I) (where $R^1$ represents a single bond), more preferably the group (I) (where $R^1$ represents a single bond), still more preferably a cyanoalkyl group, particularly preferably a cyanomethyl group or a cyanoethyl group, and further particularly preferably a cyanomethyl group.

In the case where the compound (A) is the novolac resin, the resol resin, the aromatic ring-containing vinyl resin, the acenaphthylene resin, the indene resin, the polyarylene resin, the triazine resin, the pyrene resin or the fullerene resin, the lower limit of the Mw of the compound (A) is preferably 500, and more preferably 1,000. The upper limit of the Mw of the compound (A) is preferably 50,000, more preferably 10,000, and still more preferably 8,000.

The lower limit of Mw/Mn (Mn being the polystyrene equivalent number average molecular weight as determined by GPC) of the compound (A) is preferably 1, and more preferably 1.1. The upper limit of the Mw/Mn of the compound (A) is preferably 5, more preferably 3, and still more preferably 2.

When the Mw and the Mw/Mn of the compound (A) fall within the above ranges, the flatness of the resist underlayer film can be further improved.

Aromatic Ring-Containing Compound Having Molecular Weight of No Less than 200 and No Greater than 3,000

The aromatic ring-containing compound includes the group (I) and an aromatic ring, and has a molecular weight of no less than 200 and no greater than 3,000.

The aromatic ring-containing compound is exemplified by: a compound (hereinafter, may be also referred to as "aromatic ring-containing compound (P)") that has a partial structure (hereinafter, may be also referred to as "partial structure (P)") represented by the following formula (3) and includes the group (I); a compound (hereinafter, may be also referred to as "aromatic ring-containing compound (Q)") that has a partial structure (hereinafter, may be also referred to as "partial structure (Q)") represented by the following formula (4) and includes the group (I); a compound (hereinafter, may be also referred to as "aromatic ring-containing compound (R)") represented by the following formula (5); a compound (hereinafter, may be also referred to as "aromatic ring-containing compound (S)") represented by the following formula (6); a compound (hereinafter, may be also referred to as "aromatic ring-containing compound (T)") represented by the following formula (7); and the like.

Aromatic Ring-Containing Compound (P)

The aromatic ring-containing compound (P) has the partial structure (P). The partial structure (P) is represented by the following formula (3).

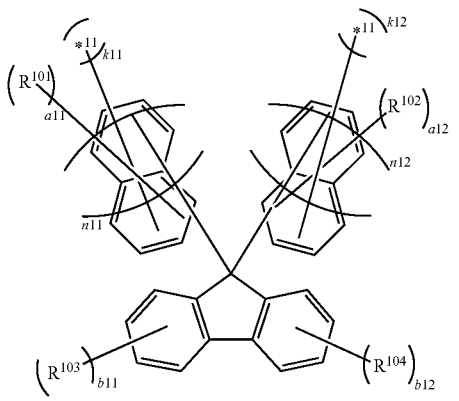

(3)

In the above formula (3), $R^{10'}$ to $R^{104}$ each independently represent a halogen atom, a hydroxy group or the group (I), wherein at least one of $R^{101}$ to $R^{104}$ represents the group (I); a11 and a12 are each independently an integer of 0 to 9; b11 and b12 are each independently an integer of 0 to 4, wherein in a case in which $R^{101}$ to $R^{104}$ are each present in a plurality of number, a plurality of $R^{101}$s may be identical or different, a plurality of $R^{102}$s may be identical or different, a plurality of $R^{103}$s may be identical or different, and a plurality of $R^{104}$s may be identical or different, wherein in the case in which $R^{103}$ is present in a plurality of number, at least two of the plurality of $R^{103}$s optionally taken together represent a ring structure having 3 to 10 ring atoms together with the carbon atom to which the at least two of the plurality of $R^{103}$s bond, and wherein in the case in which $R^{104}$ is present in a plurality of number, at least two of the plurality of $R^{104}$s optionally taken together represent a ring structure having 3 to 10 ring atoms together with the carbon atom to which the at least two of the plurality of $R^{104}$s bond; n11 and n12 are each independently an integer of 0 to 2; k11 and k12 are each independently an integer of 0 to 9, wherein the sum of a11 and k11 is no greater than 9, and the sum of a12 and k12 is no greater than 9; and $*^{11}$ represents an atomic bonding.

$R^{101}$ to $R^{104}$ each represent preferably a hydroxy group or the group (I), more preferably the group (I), still more preferably a cyanoalkyloxy group, and particularly preferably a cyanomethyloxy group or a cyanoethyloxy group, for further improvements in the flatness and the surface coating properties of the resist underlayer film.

Examples of the ring structure having 3 to 10 ring atoms which may be taken together represented by at least two of $R^{103}$s or $R^{104}$s include a monocyclic cycloalkane structure having 3 to 10 ring atoms, a polycyclic cycloalkane structure having 7 to 10 ring atoms, and the like.

The ring structure having 3 to 10 ring atoms which may be taken together represented by at least two of $R^{103}$s or $R^{104}$s is preferably an alicyclic structure, more preferably a monocyclic cycloalkane structure, and still more preferably a cyclohexane structure and thus the flatness and the surface coating properties of the resist underlayer film can be further improved.

In the above formula (3), a11 and a12 are each preferably 0 to 2, and more preferably 0 or 1 and thus the flatness and the surface coating properties of the resist underlayer film can be further improved.

In the above formula (3), b11 and b12 are each preferably 0 to 2, more preferably 0 or 1, and still more preferably 0 and thus the flatness and the surface coating properties of the resist underlayer film can be further improved.

In the above formula (3), n11 and n12 are each preferably 0 or 1, and more preferably 1 and thus the flatness of the resist underlayer film can be further improved.

In the above formula (3), k11 and k12 are each preferably 0 to 2, and more preferably 0 or 1, in light of further improvements in the flatness of the resist underlayer film and ease in synthesizing the aromatic ring-containing compound (P).

In the case in which at least one of k11 and k12 in the above formula (3) is no less than 1, the group bonded to $*^{11}$ of the partial structure (P) is exemplified by $(R^{111})_2N$—$Ar^{21}$—O—, $R^{111}O$—$Ar^{21}$—O—, $(R^{111})_2N$—$Ar^{21}$—O—$Ar^{22}$—O—, $R^{111}O$—$Ar^{21}$—O—$Ar^{22}$—O—, and the like. $R^{111}$ represents a hydrogen atom or the group (I). $Ar^{21}$ and $Ar^{22}$ each independently represent a substituted or unsubstituted arenediyl group having 6 to 20 carbon atoms.

$Ar^{21}$ represents preferably the unsubstituted arenediyl group, and more preferably a benzenediyl group. $Ar^{22}$ represents preferably a cyano-substituted arenediyl group, and more preferably a cyano-substituted benzenediyl group.

The group bonded to $*^{11}$ of the partial structure (P) of the aromatic ring-containing compound (P) is preferably $(R^{111})_2N$—$Ar^{21}$—O—$Ar^{22}$—O—, and more preferably a di(cyanomethyl)aminophenoxy cyanophenoxy group.

Specific examples of the aromatic ring-containing compound (P) include compounds represented by the following formulae (3-1) to (3-4) (hereinafter, may be also referred to as "aromatic ring-containing compounds (I-1) to (I-4)"), and the like.

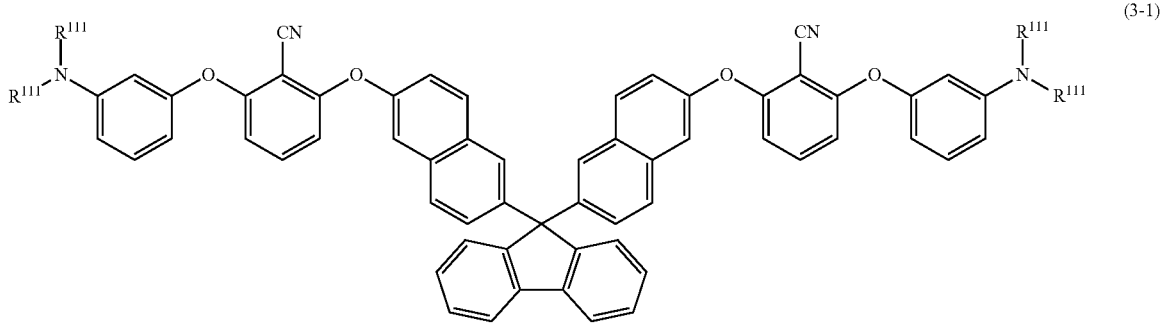

(3-1)

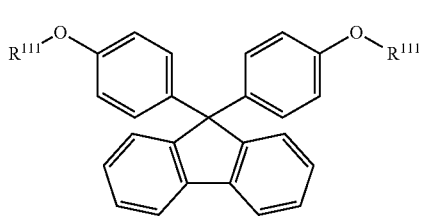
(3-2)

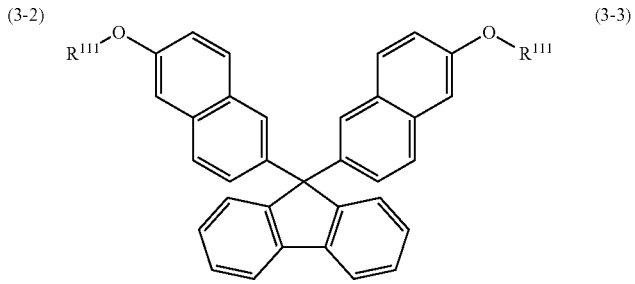
(3-3)

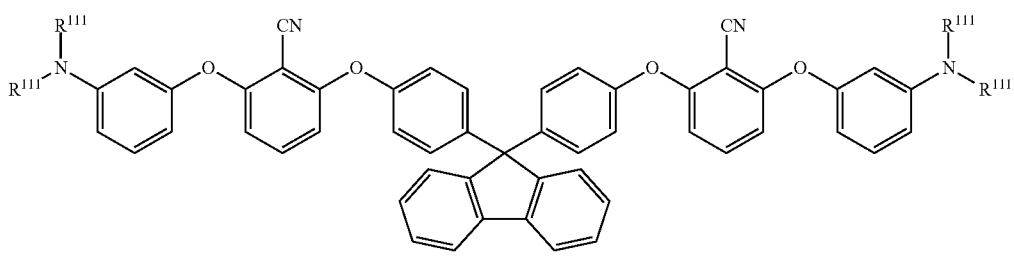
(3-4)

In the above formulae (3-1) to (3-4), $R^{111}$ represents a hydrogen atom or the group (I) (where $R^1$ represents a single bond), wherein at least one of $R^{111}$s represents the group (I) (where $R^1$ represents a single bond).

Aromatic Ring-Containing Compound (Q)

The aromatic ring-containing compound (Q) has the partial structure (Q). The partial structure (Q) is represented by the following formula (4).

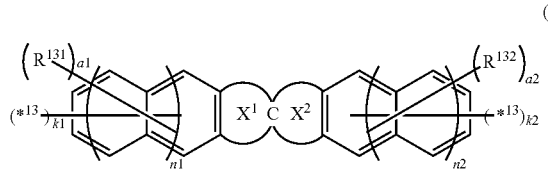
(4)

In the above formula (4), $X^1$ and $X^2$ each independently represent a substituted or unsubstituted ring structure having 4 to 10 ring atoms, together with a spiro carbon atom and a carbon atom of the aromatic ring; $R^{131}$ and $R^{132}$ each independently represent a halogen atom, a hydroxy group or the group (I), wherein at least one of $R^{131}$ and $R^{132}$ represents the group (I); a1 and a2 are each independently an integer of 0 to 8, wherein in a case in which $R^{131}$ and $R^{132}$ are each present in a plurality of number, a plurality of $R^{131}$s may be identical or different and a plurality of $R^{132}$s may be identical or different; n1 and n2 are each independently an integer of 0 to 2; k1 and k2 are each independently an integer of 0 to 8, wherein the sum of a1 and k1 is no greater than 8, and the sum of a2 and k2 is no greater than 8; and $*^{13}$ represents an atomic bonding.

In the case in which at least one of k1 and k2 in the above formula (4) is no less than 1, the group bonded to $*^{13}$ of the partial structure (Q) of the aromatic ring-containing compound (Q) is exemplified by $(R^{41})_2N-Ar^{31}-O-$, $R^{141}O-Ar^{31}-O-$, $(R^{141})_2N-Ar^{31}-O-Ar^{32}-O-$, $R^{141}O-Ar^{31}-O-Ar^{32}-O-$, and the like, wherein $R^{141}$ represents a hydrogen atom or the group (I), and $Ar^{31}$ and $Ar^{32}$ each independently represent a substituted or unsubstituted arenediyl group having 6 to 20 carbon atoms.

$Ar^{31}$ represents preferably the unsubstituted arenediyl group, and more preferably a benzenediyl group. $Ar^{32}$ represents preferably a cyano-substituted arenediyl group, and more preferably a cyano-substituted benzenediyl group.

The group bonded to $*^{13}$ of the partial structure (Q) of the aromatic ring-containing compound (Q) is preferably $(R^{141})_2N-Ar^{31}-O-Ar^{32}-O-$, and more preferably a di(cyanomethyl)aminophenoxy cyanophenoxy group.

Specific examples of the aromatic ring-containing compound (Q) include compounds represented by the following formulae (4-1) to (4-3) (hereinafter, may be also referred to as "aromatic ring-compounds (II-1) to (II-3)"), and the like.

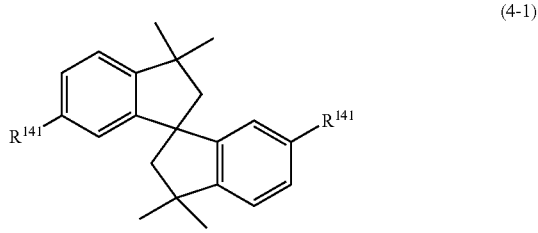
(4-1)

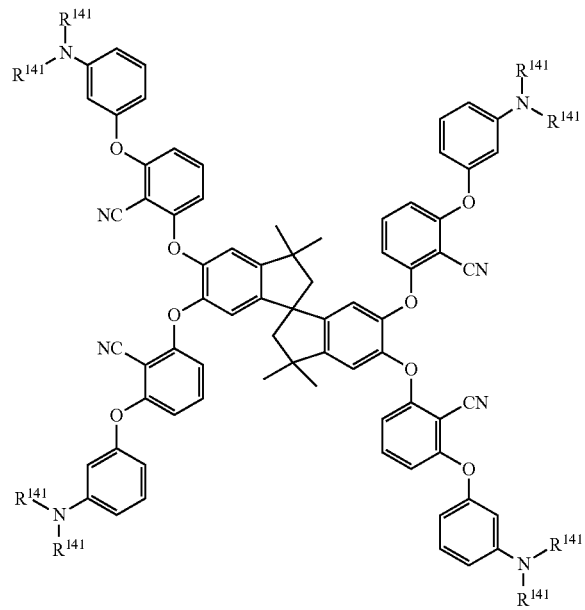
(4-2)

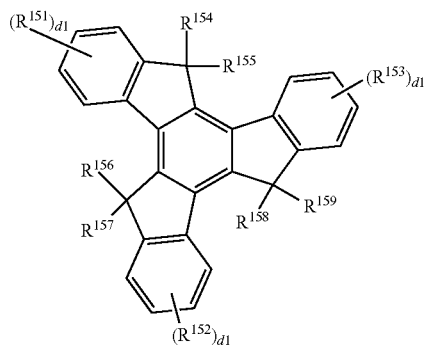
(5)

In the above formula (5), $R^{151}$ to $R^{159}$ each independently represent a hydrogen atom, a halogen atom, a hydroxy group or the group (I), wherein at least one of $R^{51}$ to $R^{159}$ represents the group (I); and d1 is each independently an integer of 0 to 4, wherein in a case in which d1 is no less than 2, a plurality of $R^{151}$s may be identical or different, a plurality of $R^{152}$s may be identical or different, and a plurality of $R^{153}$s may be identical or different.

Specific examples of the aromatic ring-containing compound (R) include compounds represented by the following formulae (5-1) to (5-3), and the like.

(4-3)

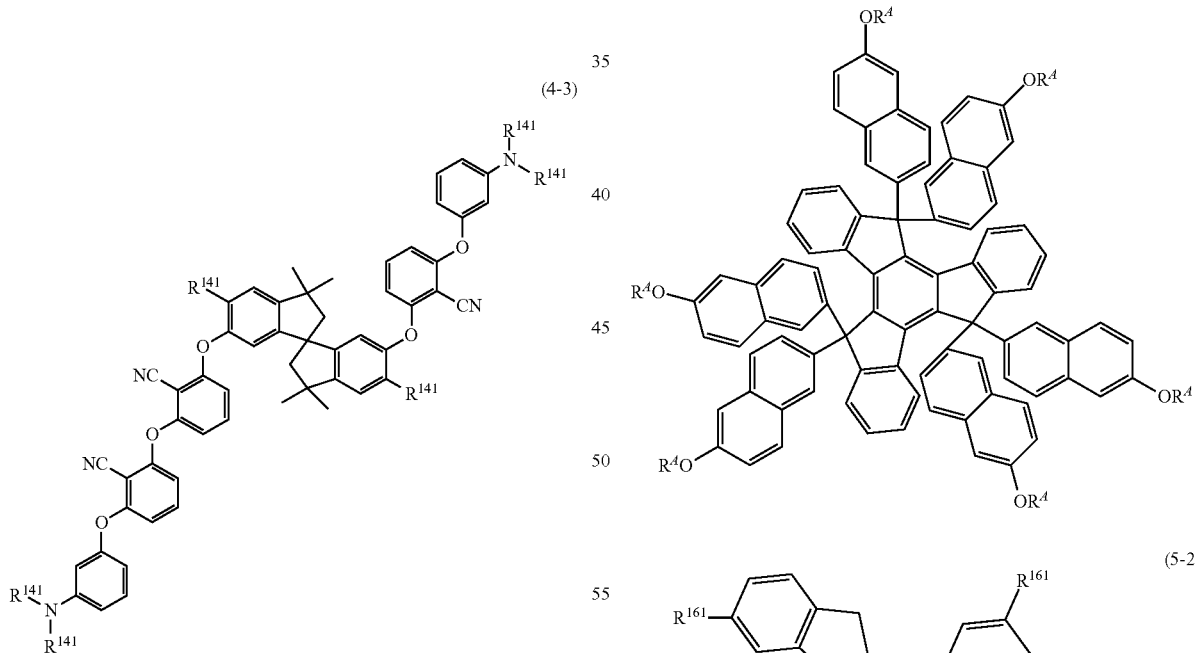
(5-1)

In the above formulae (4-1) to (4-3), $R^{141}$ each independently represent a hydrogen atom or the group (I), wherein at least one of $R^{141}$s represents the group (I).

Aromatic Ring-Containing Compound (R)

The aromatic ring-containing compound (R) is represented by the following formula (5). The aromatic ring-containing compound (R) has a truxene structure.

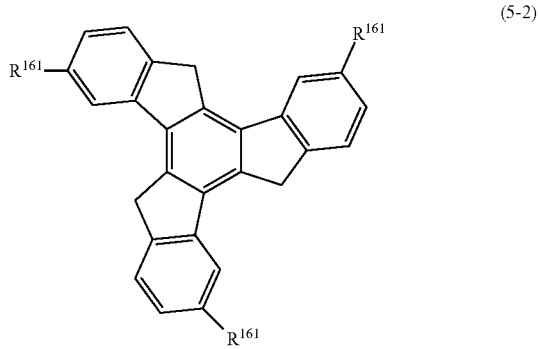
(5-2)

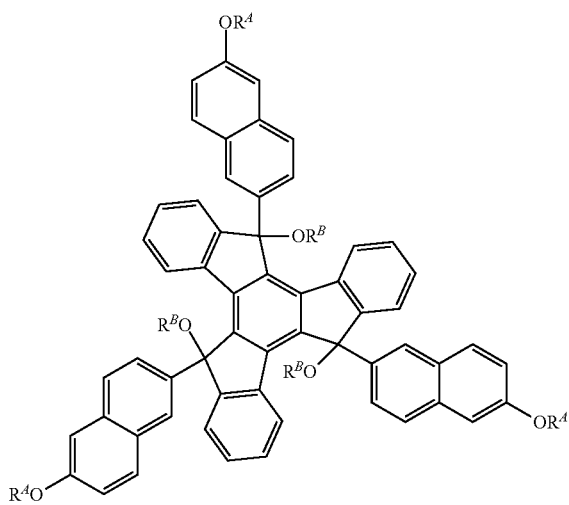

(5-3)

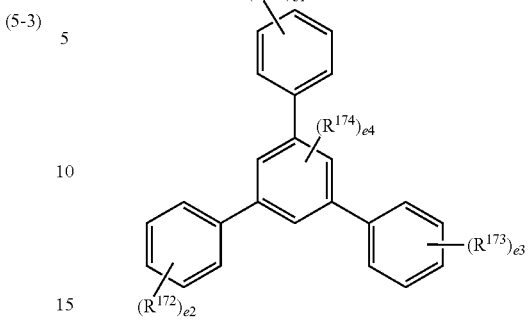

(6)

In the above formula (5-1), $R^A$ represents a hydrogen atom, the group (I) (where $R^1$ represents a single bond) or a monovalent organic group having 1 to 30 carbon atoms other than the group (I), wherein at least one of six $R^A$s represents the group (I) (where $R^1$ represents a single bond).

In the above formula (5-3), $R^A$ represents a hydrogen atom, the group (I) (where $R^1$ represents a single bond) or a monovalent organic group having 1 to 30 carbon atoms other than the group (I); $R^B$ represents a hydrogen atom, the group (I) (where $R^1$ represents a single bond) or a monovalent organic group having 1 to 30 carbon atoms other than the group (I), wherein at least one of three $R^A$s and three $R^B$s represents the group (I) (where $R^1$ represents a sing bond).

In the above formula (5-2), $R^{161}$ represents a hydrogen atom, a halogen atom, a hydroxy group or the group (I), wherein at least one of three $R^{161}$s represents the group (I).

$R^A$ represents preferably a hydrogen atom or the group (I) (where $R^1$ represents a single bond), more preferably the group (I) (where $R^1$ represents a single bond), still more preferably a cyanoalkyl group, particularly preferably a cyanomethyl group or a cyanoethyl group, and further particularly preferably a cyanomethyl group.

$R^B$ represents preferably a hydrogen atom or the group (I) (where $R^1$ represents a single bond).

$R^{161}$ represents preferably the group (I), more preferably a cyanoalkyloxy group, still more preferably a cyanomethyloxy group or a cyanoethyloxy group, and particularly preferably a cyanomethyloxy group.

Aromatic Ring-Containing Compound (S)

The aromatic ring-containing compound (S) is represented by the following formula (6). The aromatic ring-containing compound (S) has a triphenylbenzene structure.

In the above formula (6), $R^{171}$ to $R^{174}$ each represent a halogen atom, a hydroxy group, the group (I) or a monovalent group including the group (I), wherein at least one of $R^{171}$ to $R^{174}$ represents the group (I) or a monovalent group including the group (I); e1 to e3 are each independently an integer of 0 to 5, wherein in a case in which each of e1 to e3 is no less than 2, a plurality of $R^{171}$s may be identical or different, a plurality of $R^{172}$s may be identical or different, and a plurality of $R^{173}$s may be identical or different; and e4 is an integer of 0 to 3, wherein in a case in which e4 is no less than 2, a plurality of $R^{174}$s may be identical or different.

The monovalent group including the group (I) which may be represented by $R^{171}$ to $R^{174}$ is exemplified by an aryl group to which the group (I) is bonded, an arylethynyl group to which the group (I) is bonded, and the like. Of these, the arylethynyl group to which the group (I) is bonded is preferred, and a phenylethynyl group to which the group (I) is bonded is more preferred.

Specific examples of the aromatic ring-containing compound (S) include compounds represented by the following formulae (6-1) to (6-3), and the like.

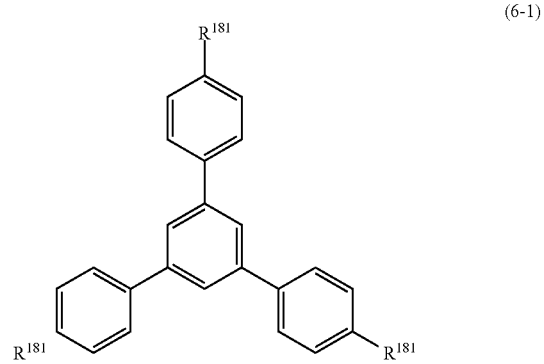

(6-1)

-continued (6-2)

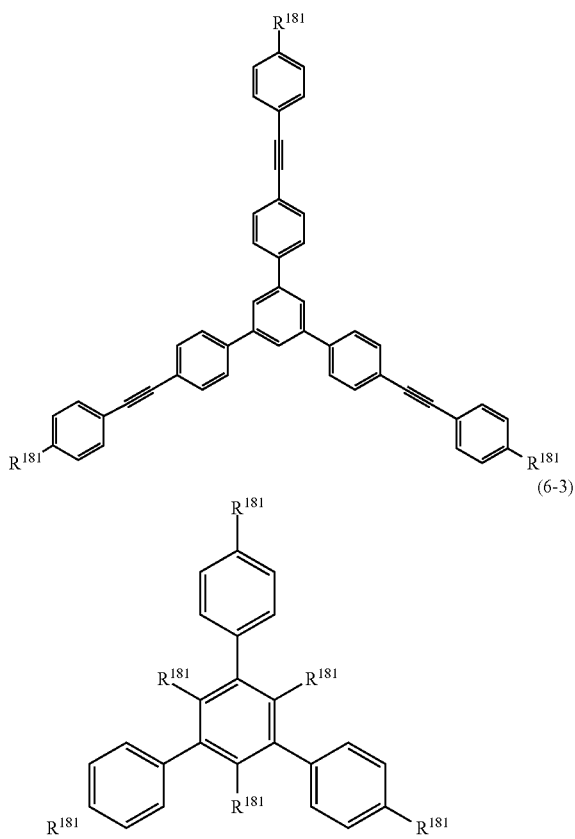

(6-3)

In the above formulae (6-1) to (6-3), $R^{181}$ represents a halogen atom, a hydroxy group, the group (I) or a monovalent group including the group (I), wherein at least one of $R^{181}$s represents the group (I) or a monovalent group including the group (I).

Aromatic Ring-Containing Compound (T)

The aromatic ring-containing compound (T) is represented by the following formula (7). The aromatic ring-containing compound (T) has a pyrene structure.

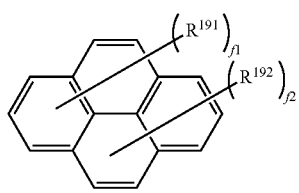

(7)

In the above formula (7), $R^{191}$ and $R^{192}$ each represent a halogen atom, a hydroxy group, the group (I) or a monovalent group including the group (I), wherein at least one of $R^{191}$ and $R^{192}$ represents the group (I) or a monovalent group including the group (I); and f1 and f2 are each independently an integer of 0 to 5, wherein the sum of f1 and f2 is no less than 1, and wherein in a case in which each of f1 and f2 is no less than 2, a plurality of $R^{191}$s may be identical or different and a plurality of $R^{192}$s may be identical or different.

Specific examples of the aromatic ring-containing compound (T) include a compound represented by the following formula (7-1), and the like.

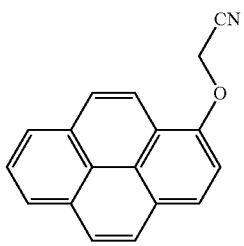

(7-1)

The lower limit of the molecular weight of the aromatic ring-containing compound is preferably 200, more preferably 400, still more preferably 500, and particularly preferably 600. The upper limit of the molecular weight of the aromatic ring-containing compound is preferably 2,000, more preferably 1,500, and still more preferably 1,300. When the molecular weight of the aromatic ring-containing compound falls within the above range, the flatness of the resist underlayer film can be further improved.

(B) Solvent

The composition for resist underlayer film formation contains the solvent (B). The solvent (B) is not particularly limited as long as the solvent (B) can dissolve or disperse therein the compound (A) and the optional component contained as needed.

The solvent (B) is exemplified by an alcohol solvent, a ketone solvent, an ether solvent, an ester solvent, a nitrogen-containing solvent, and the like. The solvent (B) may be used either alone of one type, or in combination of two or more types thereof.

Examples of the alcohol solvent include: monohydric alcohol solvents such as methanol, ethanol, n-propanol, iso-propanol, n-butanol and iso-butanol; polyhydric alcohol solvents such as ethylene glycol, 1,2-propylene glycol, diethylene glycol and dipropylene glycol; and the like.

Examples of the ketone solvent include acetone, methyl ethyl ketone, methyl n-propyl ketone, methyl iso-butyl ketone, cyclohexanone, and the like.

Examples of the ether solvent include ethyl ether, iso-propyl ether, ethylene glycol dibutyl ether, diethylene glycol monomethyl ether, diethylene glycol monoethyl ether, diethylene glycol diethyl ether, propylene glycol monomethyl ether, propylene glycol monoethyl ether, propylene glycol monopropyl ether, tetrahydrofuran, and the like.

Examples of the ester solvent include ethyl acetate, γ-butyrolactone, n-butyl acetate, ethylene glycol monomethyl ether acetate, ethylene glycol monoethyl ether acetate, diethylene glycol monomethyl ether acetate, diethylene glycol monoethyl ether acetate, propylene glycol monomethyl ether acetate, propylene glycol monoethyl ether acetate, dipropylene glycol monomethyl ether acetate, dipropylene glycol monoethyl ether acetate, ethyl propionate, n-butyl propionate, methyl lactate, ethyl lactate, and the like.

Examples of the nitrogen-containing solvent include N,N-dimethylformamide, N,N-dimethylacetamide, N-methylpyrrolidone, and the like.

Of these, the ether solvent and the ester solvent are preferred, and an ether solvent and an ester solvent each having a glycol structure are more preferred due to superior film formability.

Examples of the ether solvent and the ester solvent each having a glycol structure include propylene glycol monomethyl ether, propylene glycol monoethyl ether, propylene glycol monopropyl ether, propylene glycol monomethyl ether acetate, propylene glycol monoethyl ether acetate, propylene glycol monopropyl ether acetate, and the like. Of these, propylene glycol monoethyl ether acetate is particularly preferred.

The lower limit of the percentage content of the ether solvent and the ester solvent each having a glycol structure in the solvent (B) is preferably 20% by mass, more preferably 60% by mass, still more preferably 90% by mass, and particularly preferably 100% by mass.

(C) Acid Generating Agent

The acid generating agent (C) is a component that generates an acid therefrom by an action of heat and/or light and facilitates crosslinking of molecules of the compound (A). When the composition for resist underlayer film formation contains the acid generating agent (C), the crosslinking reaction of the compound (A) may be facilitated and the hardness of the resist underlayer film formed can be further enhanced. The acid generating agent (C) may be used either alone of one type, or in combination of two or more types thereof.

The acid generating agent (C) is exemplified by onium salt compounds, N-sulfonyloxyimide compounds, and the like.

An exemplary onium salt compound is a sulfonium salt, a tetrahydrothiophenium salt, an iodonium salt, an ammonium salt, or the like.

Examples of the sulfonium salt include those described in paragraph [0110] of Japanese Unexamined Patent Application, Publication No. 2014-037386, and specific examples include triphenylsulfonium trifluoromethanesulfonate, triphenylsulfonium nonafluoro-n-butanesulfonate, triphenylsulfonium 2-bicyclo[2.2.1]hept-2-yl-1,1,2,2-tetrafluoroethanesulfonate, 4-cyclohexylphenyldiphenylsulfonium trifluoromethanesulfonate, and the like.

Examples of the tetrahydrothiophenium salt include those described in paragraph [0111] of Japanese Unexamined Patent Application, Publication No. 2014-037386, and specific examples include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl) tetrahydrothiophenium 2-bicyclo[2.2.1]hept-2-yl-1,1,2,2-tetrafluoroethanesulfonate, and the like.

Examples of the iodonium salt include those described in paragraph [0112] of Japanese Unexamined Patent Application, Publication No. 2014-037386, and specific examples include diphenyliodonium trifluoromethanesulfonate, diphenyliodonium nonafluoro-n-butanesulfonate, diphenyliodonium 2-bicyclo[2.2.1]hept-2-yl-1,1,2,2-tetrafluoroethanesulfonate, bis(4-t-butylphenyl)iodonium nonafluoro-n-butanesulfonate, and the like.

Examples of the ammonium salt include trimethylammonium nonafluoro-n-butanesulfonate, triethylammonium nonafluoro-n-butanesulfonate, and the like.

Examples of the N-sulfonyloxyimide compound include those described in paragraph [0113] of Japanese Unexamined Patent Application, Publication No. 2014-037386, and specific examples include N-(trifluoromethanesulfonyloxy)bicyclo[2.2.1]hept-5-ene-2,3-dicarboxyimide, N-(nonafluoro-n-butanesulfonyloxy)bicyclo[2.2.1]hept-5-ene-2,3-dicarboxyimide, N-(2-bicyclo[2.2.1]hept-2-yl-1,1,2,2-tetrafluoroethanesulfonyloxy)bicyclo[2.2.1]hept-5-ene-2,3-dicarboxyimide, and the like.

Of these, the onium salt compound is preferred, the iodonium salt and the ammonium salt are more preferred, and bis(4-t-butylphenyl)iodonium nonafluoro-n-butanesulfonate and triethylammonium nonafluoro-n-butanesulfonate are still more preferred, as the acid generating agent (C).

When the composition for resist underlayer film formation contains the acid generating agent (C), the lower limit of the amount of the acid generating agent (C) contained with respect to 100 parts by mass of the compound (A) is preferably 0.1 parts by mass, more preferably 1 part by mass, and still more preferably 3 parts by mass. The upper limit of the amount of the acid generating agent (C) contained is preferably 20 parts by mass, more preferably 15 parts by mass, and still more preferably 10 parts by mass. When the amount of the acid generating agent (C) contained falls within the above range, the crosslinking reaction of the compound (A) may be more effectively facilitated.

(D) Crosslinking Agent

The crosslinking agent (D) forms a crosslinking bond between molecules of the component such as the compound (A) in the composition for resist underlayer film formation or forms a cross-linked structure per se, by an action of heat and/or an acid. When the composition for underlayer film formation contains the crosslinking agent (D), the hardness of the resist underlayer film formed can be enhanced. The crosslinking agent (D) may be used either alone of one type, or in combination of two or more types thereof.

The crosslinking agent (D) is exemplified by polyfunctional (meth)acrylate compounds, epoxy compounds, hydroxymethyl group-substituted phenol compounds, alkoxyalkyl group-containing phenol compounds, compounds having an alkoxyalkylated amino group, random copolymers of acenaphthylene with hydroxymethylacenaphthylene represented by the following formula (11-P), compounds represented by the following formulae (11-1) to (11-12), and the like.

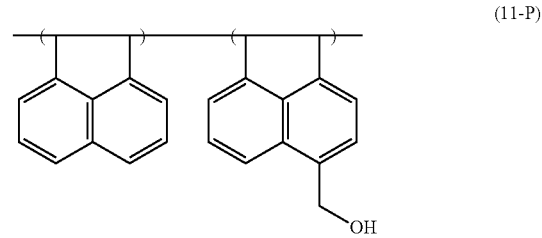

(11-P)

Examples of the polyfunctional (meth)acrylate compound include trimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, glycerin tri(meth)acrylate, tris(2-hydroxyethyl)isocyanurate tri(meth)acrylate, ethylene glycol di(meth)acrylate, 1,3-butanediol di(meth)acrylate, 1,4-butanediol di(meth)acrylate, 1,6-hexanediol di(meth)acrylate, neopentyl glycol di(meth)acrylate, diethylene glycol di(meth)acrylate, triethylene glycol di(meth)acrylate, dipropylene glycol di(meth)acrylate, bis(2-hydroxyethyl)isocyanurate di(meth)acrylate, and the like.

Examples of the epoxy compound include novolak epoxy resins, bisphenol epoxy resins, alicyclic epoxy resins, aliphatic epoxy resins, and the like.

Examples of the hydroxymethyl group-substituted phenol compound include 2-hydroxymethyl-4,6-dimethylphenol, 1,3,5-trihydroxymethylbenzene, 3,5-dihydroxymethyl-4-methoxytoluene (2,6-bis(hydroxymethyl)-p-cresol), and the like.

An exemplary alkoxyalkyl group-containing phenol compound is a methoxymethyl group-containing phenol compound, an ethoxymethyl group-containing phenol compound, or the like. Examples of the methoxymethyl group-containing phenol compound include a compound represented by the following formula (11-Q).

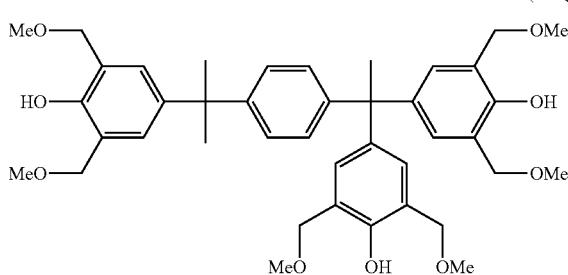
(11-Q)

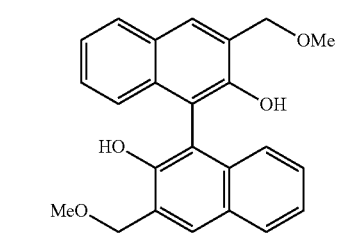
(11-1)

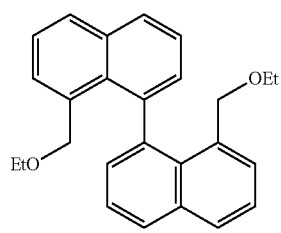
(11-2)

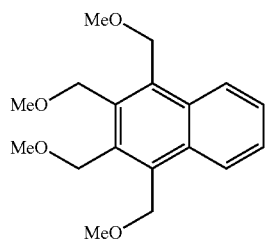
(11-3)

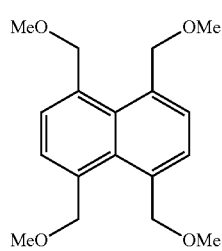
(11-4)

-continued

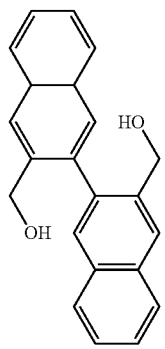
(11-5)

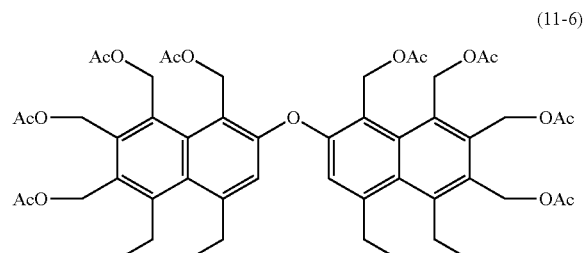
(11-6)

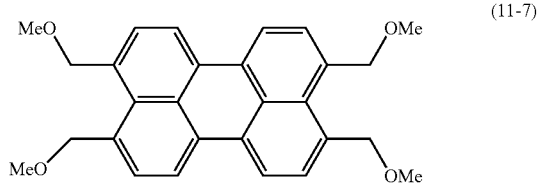
(11-7)

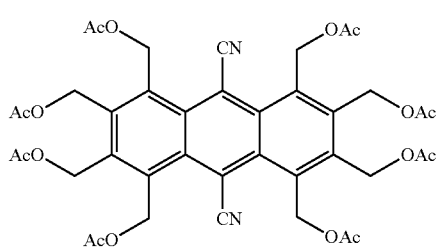
(11-8)

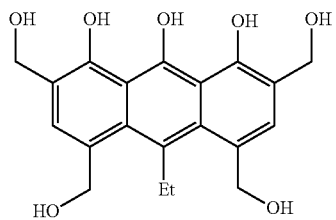
(11-9)

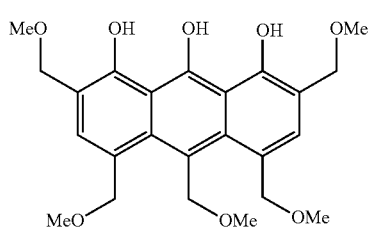
(11-10)

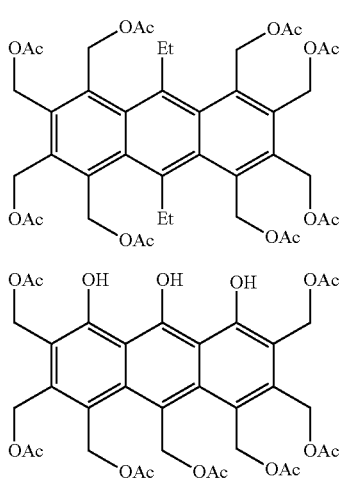

(11-11)

(11-12)

In the above formulae, Me represents a methyl group, Et represents an ethyl group, and Ac represents an acetyl group.

It is to be noted that the compounds represented by the above formulae (11-1) to (11-12) each may be synthesized with reference to the following documents.

The compound represented by the formula (11-1):
Guo, Qun-Sheng; Lu, Yong-Na; Liu, Bing; Xiao, Jian; and Li, Jin-Shan, Journal of Organometallic Chemistry, 2006, vol. 691, #6, p. 1282-1287.

The compound represented by the formula (11-2):
Badar, Y. et al., Journal of the Chemical Society, 1965, p. 1412-1418.

The compound represented by the formula (11-3):
Hsieh, Jen-Chieh; and Cheng, Chien-Hong, Chemical Communications (Cambridge, United Kingdom), 2008, #26, p. 2992-2994.

The compound represented by the formula (11-4):
Japanese Unexamined Patent Application, Publication No. H5-238990.

The compound represented by the formula (11-5):
Bacon, R. G. R.; and Bankhead, R., Journal of the Chemical Society, 1963, p. 839-845.

The compounds represented by the formulae (11-6), (11-8), (11-11) and (11-12):
Macromolecules, 2010, vol. 43, p. 2832-2839.

The compounds represented by the formulae (11-7), (11-9) and (11-10):
Polymer Journal, 2008, vol. 40, No. 7, p. 645-650; and Journal of Polymer Science: Part A, Polymer Chemistry, Vol. 46, p. 4949-4958.

The compound having an alkoxyalkylated amino group is exemplified by a nitrogen-containing compound having a plurality of active methylol groups in a molecule thereof wherein the hydrogen atom of the hydroxyl group of at least one of the methylol groups is substituted with an alkyl group such as a methyl group or a butyl group, and the like; examples thereof include (poly)methylolated melamines, (poly)methylolated glycolurils, (poly)methylolated benzoguanamines, (poly)methylolated ureas, and the like. It is to be noted that a mixture constituted with a plurality of substituted compounds described above may be used as the compound having an alkoxyalkylated amino group, and the compound having an alkoxyalkylated amino group may contain an oligomer component formed through partial self-condensation thereof. Examples of the compound having an alkoxyalkylated amino group include 1,3,4,6-tetrakis(methoxymethyl)glycoluril, and the like.

Among these crosslinking agents (D), the methoxymethyl group-containing phenol compound, the compound having an alkoxyalkylated amino group, and the random copolymer of acenaphthylene with hydroxymethylacenaphthylene are preferred, the methoxymethyl group-containing phenol compound and the compound having an alkoxyalkylated amino group are more preferred, and 4,4'-(1-(4-(1-(4-hydroxy-3,5-bis(methoxymethyl)phenyl)-1-methylethyl)phenyl)ethylidene)bis(2,6-bis(methoxymethyl)phenol) (i.e., the compound represented by the above formula (11-Q)) and 1,3,4,6-tetrakis(methoxymethyl)glycoluril are still more preferred.

When the composition for resist underlayer film formation contains the crosslinking agent (D), the lower limit of the amount of the crosslinking agent (D) contained with respect to 100 parts by mass of the compound (A) is preferably 0.1 parts by mass, more preferably 0.5 parts by mass, still more preferably 1 part by mass, and particularly preferably 3 parts by mass. The upper limit of the amount of the crosslinking agent (C) contained is preferably 100 parts by mass, more preferably 50 parts by mass, still more preferably 30 parts by mass, and particularly preferably 20 parts by mass. When the amount of the crosslinking agent (D) contained falls within the above range, the crosslinking reaction of the compound (A) may be more effectively facilitated.

Other Optional Component

The other optional component is exemplified by a surfactant, an adhesion aid, and the like.

Surfactant

When the composition for resist underlayer film formation contains a surfactant, the coating properties can be improved, and as a result, uniformity of the surface of the film provided may be improved, and occurrence of the unevenness of coating can be inhibited. The surfactant may be used either alone of one type, or in combination of two or more types thereof.

Examples of the surfactant include nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate and polyethylene glycol distearate, and the like. Also, examples of commercially available products include KP341 (Shin-Etsu Chemical Co., Ltd.), Polyflow No. 75 and No. 95 (each available from Kyoeisha Chemical Co., Ltd.), F-top EF101, EF204, EF303 and EF352 (each available from Tochem Products Co. Ltd.), Megaface F171, F172 and F173 (each available from DIC Corporation), Fluorad FC430, FC431, FC135 and FC93 (each available from Sumitomo 3M Limited), ASAHI GUARD AG710, Surflon S382, SC101, SC102, SC103, SC104, SC105 and SC106 (each available from Asahi Glass Co., Ltd.), and the like.

When the composition for resist underlayer film formation contains the surfactant, the lower limit of the amount of the surfactant contained with respect to 100 parts by mass of the compound (A) is preferably 0.01 parts by mass, more preferably 0.05 parts by mass, and still more preferably 0.1 parts by mass. The upper limit of the amount of the surfactant contained is preferably 10 parts by mass, more preferably 5 parts by mass, and still more preferably 1 part by mass. When the amount of the surfactant contained falls within the above range, the coating properties of the composition for resist underlayer film formation can be further improved.

Adhesion Aid

The adhesion aid is a component that improves adhesiveness to an underlying material. When the composition for resist underlayer film formation contains the adhesion aid, the adhesiveness of the formed resist underlayer film to a substrate, etc., as an underlying material can be improved. The adhesion aid may be used either alone of one type, or in combination of two or more types thereof.

When the composition for resist underlayer film formation contains the adhesion aid, the lower limit of the amount of the adhesion aid contained with respect to 100 parts by mass of the compound (A) is preferably 0.01 parts by mass, more preferably 0.05 parts by mass, and still more preferably 0.1 parts by mass. The upper limit of the amount of the adhesive aid contained is preferably 20 parts by mass, more preferably 10 parts by mass, and still more preferably 5 parts by mass.

Procedure for Preparing Composition for Resist Underlayer Film Formation

The composition for resist underlayer film formation may be prepared by mixing the compound (A) and the solvent (B), as well as the acid generating agent (C) and/or the crosslinking agent (D) and other optional components which may be added as needed, in a predetermined ratio, and preferably filtering a resulting mixture through, for example, a membrane filter having a pore size of about 0.1 μm. The lower limit of the solid content concentration of the composition for resist underlayer film formation is preferably 0.1% by mass, more preferably 1% by mass, still more preferably 2% by mass, and particularly preferably 4% by mass. The upper limit of the solid content concentration is preferably 50 parts by mass, more preferably 30 parts by mass, still more preferably 15 parts by mass, and particularly preferably 8 parts by mass. As the solid content concentration, the solid content concentration (% by mass) of the composition for resist underlayer film formation was determined by baking 0.5 g of the composition for resist underlayer film formation at 250° C. for 30 min and measuring the mass of the solid content in 0.5 g of the composition for resist underlayer film formation.

Method for Producing Patterned Substrate

A method for producing a patterned substrate according to still another embodiment of the present invention includes: forming a resist underlayer film directly or indirectly on an upper face side of a substrate (hereinafter, may be also referred to as "resist underlayer-forming step"); forming a resist pattern directly or indirectly on an upper face side of the resist underlayer film (hereinafter, may be also referred to as "resist pattern-forming step"); and forming a pattern on the substrate by etching the substrate a plurality of times using the resist pattern as a mask (hereinafter, may be also referred to as "substrate pattern-forming step"). In the method for producing a patterned substrate, the resist underlayer film is formed from the composition for resist underlayer film formation of the embodiment of the present invention described above.

Since the above-described composition for resist underlayer film formation is used, the method for producing a patterned substrate enables the formation of a resist underlayer film superior in flatness as well as in solvent resistance, etching resistance and heat resistance, and a patterned substrate having a superior pattern configuration can be obtained through the use of the resist underlayer film having such superior characteristics.

Resist Underlayer Film-Forming Step

In this step, a resist underlayer film is formed directly or indirectly on the upper face side of the substrate, from the composition for resist underlayer film formation. The formation of the resist underlayer film is typically carried out by applying the composition for resist underlayer film formation directly or indirectly on the upper face side of the substrate to provide a coating film, and heating the coating film.

Examples of the substrate include a silicon wafer, a wafer coated with aluminum, and the like. Moreover, the process for applying the composition for resist underlayer film formation onto the substrate or the like is not particularly limited, and for example, an appropriate process such as a spin-coating process, a cast coating process or a roll coating process may be employed.

The heating of the coating film is typically carried out in an ambient air. The lower limit of the heating temperature is preferably 150° C., more preferably 180° C., and still more preferably 200° C. The upper limit of the heating temperature is preferably 500° C., more preferably 380° C., and still more preferably 300° C. When the heating temperature is less than 150° C., the oxidative crosslinking may not sufficiently proceed, and characteristics necessary for use in the resist underlayer film may not be exhibited. The lower limit of the heating time period is preferably 15 sec, more preferably 30 sec, and still more preferably 45 sec. The upper limit of the heating time period is preferably 1,200 sec, more preferably 600 sec, and still more preferably 300 sec.

The coating film may be preheated in the temperature range of 60° C. to 250° C. before being heated in the temperature range of 150° C. to 500° C. The lower limit of the preheating time period in the preheating is preferably 10 sec, and more preferably 30 sec. The upper limit of the preheating time period in the preheating is preferably 300 sec, and more preferably 180 sec. The preheating makes the film dense by evaporation of solvent and thus a dehydrogenation reaction can efficiently proceed in the subsequent heating.

It is to be noted that in the resist underlayer film formation procedure, the resist underlayer film is typically formed through the heating of the coating film; however, in a case where the composition for resist underlayer film formation contains the acid generating agent (C), the resist underlayer film may also be formed by hardening the coating film through a combination of an exposure and heating. Radioactive rays used for the exposure may be appropriately selected from: electromagnetic waves such as visible rays, ultraviolet rays, far ultraviolet rays, X-rays and γ-rays; particle rays such as electron beams, molecular beams and ion beams; and the like, depending on the type of the acid generating agent (C).

The lower limit of the average thickness of the resist underlayer film formed is preferably 0.05 μm, more preferably 0.1 μm, and still more preferably 0.5 μm. The upper limit of the average thickness of the resist underlayer film formed is preferably 5 μm, more preferably 3 μm, and still more preferably 2 μm.

After the resist underlayer film-forming step, the procedure may further include as needed, the step of forming an intermediate layer (intermediate film) directly or indirectly on the upper face side of the resist underlayer film. The intermediate layer as referred to means a layer having a function that is exhibited or not exhibited by the resist underlayer film and/or the resist film in resist pattern formation in order to further enhance the function exhibited by the resist underlayer film and/or the resist film, or to impart to the resist underlayer film and/or the resist film a function not exhibited thereby. For example, when an antireflective film is provided as the intermediate layer, an antireflecting function of the resist underlayer film can be further enhanced.

The intermediate layer may be formed from an organic compound and/or an inorganic oxide. Examples of the organic compound include commercially available products such as "DUV-42", "DUV-44", "ARC-28" and "ARC-29" (each available from Brewer Science); "AR-3" and "AR-19" (each available from Lohm and Haas Company); and the like. Examples of the inorganic oxide include commercially available products such as "NFC SOG01", "NFC SOG04" and "NFC SOG080" (each available from JSR), and the like. Moreover, polysiloxanes (silicon oxides), titanium oxides, aluminum oxides, tungsten oxides, and the like that are provided through a CVD process may be used as the inorganic oxide.

The process for providing the intermediate layer is not particularly limited, and for example, a coating process, a CVD process, or the like may be employed. Of these, the coating process is preferred. In the case where the coating process is employed, the intermediate layer may be successively provided after the resist underlayer film is provided. Moreover, the average thickness of the intermediate layer may be appropriately selected depending on the function required for the intermediate layer, and the lower limit of the average thickness of the intermediate layer is preferably 10 nm, and more preferably 20 nm. The upper limit of the average thickness of the intermediate layer is preferably 3,000 nm, and more preferably 300 nm.

Resist Pattern-Forming Step

In this step, a resist pattern is formed directly or indirectly on the upper face side of the resist underlayer film. This step may be carried out by, for example, using a resist composition.

When the resist composition is used, specifically, the resist film is formed by: applying the resist composition such that a resulting resist film has a predetermined thickness; and thereafter subjecting the resist composition to preheating to evaporate the solvent in the coating film.

The resist composition is exemplified by: a positive-tone or negative-tone chemically amplified resist composition that contains a radiation-sensitive acid generating agent; a positive-tone resist composition that contains an alkali-soluble resin and a quinone diazide-type photosensitizing agent; a negative-tone resist composition that contains an alkali-soluble resin and a crosslinking agent; and the like.

The lower limit of the solid content concentration of the resist composition is preferably 0.3% by mass, and more preferably 1% by mass. The upper limit of the solid content concentration of the resist composition is preferably 50% by mass, and more preferably 30% by mass. Moreover, the resist composition is generally used for providing a resist film, for example, after being filtered through a filter having a pore size of about 0.2 µm. It is to be noted that a commercially available resist composition may be used as is in this step.

The process for applying the resist composition is not particularly limited, and examples thereof include a spin-coating process, and the like. The temperature in the preheating may be appropriately adjusted in accordance with the type of the resist composition employed and the like. The lower limit of the temperature is preferably 30° C., and more preferably 50° C. The upper limit of the temperature in the preheating is preferably 200° C., and more preferably 150° C. The lower limit of the preheating time period in the preheating is preferably 10 sec, and more preferably 30 sec. The upper limit of the preheating time period is preferably 600 sec, and more preferably 300 sec.

Next, the resist film formed is exposed by selective irradiation with radioactive rays. Radioactive rays used for the exposure may be appropriately selected from: electromagnetic waves such as visible rays, ultraviolet rays, far ultraviolet rays, X-rays and γ-rays; and particle rays such as electron beams, molecular beams and ion beams, depending on the type of the radiation-sensitive acid generating agent used for the resist composition. Of these, far ultraviolet rays are preferred; a KrF excimer laser beam (wavelength: 248 nm), an ArF excimer laser beam (wavelength: 193 nm), an $F_2$ excimer laser beam (wavelength: 157 nm), a $Kr_2$ excimer laser beam (wavelength: 147 nm), an ArKr excimer laser beam (wavelength: 134 nm) and extreme ultraviolet radiation (EUV; wavelength: 13.5 nm), etc., are more preferred; and a KrF excimer laser bean, an ArF excimer laser beam and EUV are still more preferred.

Post-baking may be carried out after the exposure for the purpose of improving a resolution, a pattern profile, developability, and the like. The temperature in the post-baking may be appropriately adjusted in accordance with the type of the resist composition employed and the like. The lower limit of the temperature is preferably 50° C., and more preferably 70° C. The upper limit of the temperature in the post-baking is preferably 200° C., and more preferably 150° C. The lower limit of the time period of the post-baking is preferably 10 sec, and more preferably 30 sec. The upper limit of the time period of the post-baking is preferably 600 sec, and more preferably 300 sec.

Next, the exposed resist film is developed with a developer solution to form a resist pattern. The development may be carried out with an alkali or an organic solvent. Examples of the alkaline developer solution include aqueous alkaline solutions prepared by dissolving at least one alkaline compound such as sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo-[5.4.0]-7-undecene and 1,5-diazabicyclo-[4.3.0]-5-nonene, and the like. An appropriate amount of a water soluble organic solvent, e.g., an alcohol such as methanol and ethanol, a surfactant, and the like may be added to the alkaline aqueous solution. Alternatively, in the case of a development with an organic solvent, examples of the developer solution include a variety of organic solvents exemplified as the solvent (B) of the composition for resist underlayer film formation described above, and the like.

A predetermined resist pattern is formed by the development with the developer solution, and thereafter by washing and drying.

Moreover, a procedure involving nanoimprinting, a procedure involving the use of a directed self-assembling composition, or the like may be also employed as the procedure for executing the resist pattern-forming step in place of the procedure using the resist composition as described above.

Resist Pattern-Forming Step

In this step, a pattern is formed on the substrate by etching the substrate a plurality of times using the resist pattern as a mask. In a case where the intermediate layer is not provided, the resist underlayer film and the substrate are subjected to etching sequentially in this order. In a case where the intermediate layer is provided, the intermediate layer, the resist underlayer film and the substrate are subjected to etching sequentially in this order. The etching procedure may be exemplified by dry etching, wet etching, and the like. Of these, dry etching is preferred for further superior substrate pattern configuration. For example, gas plasma such as oxygen plasma or the like may be used in the dry etching. After the etching, the substrate having a predetermined pattern can be obtained.

Resist Underlayer Film

A resist underlayer film according to another embodiment of the present invention is formed from the composition for resist underlayer film formation of the embodiment of the present invention described above. Since the resist underlayer film is formed from the above-described composition for resist underlayer film formation, the resist underlayer film is superior in flatness as well as in solvent resistance, etching resistance and heat resistance.

EXAMPLES

Hereinafter, the embodiments of the present invention will be described in more detail by way of Examples, but the present invention is not in any way limited to these Examples. The procedures for measuring various types of physical properties are shown below.

Mw and Mn

The Mw and the Mn of the compound (A) were determined by gel permeation chromatography (detector: differential refractometer) using GPC columns ("G2000HXL"×2 and "G3000HXL"×1) available from Tosoh Corporation and monodisperse polystyrenes as a standard under analytical conditions involving a flow rate of 1.0 mL/min, an elution solvent of tetrahydrofuran and a column temperature of 40° C.

Solid Content Concentration

The solid content concentration (% by mass) of the composition for resist underlayer film formation was determined by baking 0.5 g of the composition for resist underlayer film formation at 250° C. for 30 min and measuring the mass of the solid content in 0.5 g of the composition for resist underlayer film formation.

Average Thickness of Film

The average thickness of the film was determined by using a spectroscopic ellipsometer ("M2000D", available from J. A. WOOLLAM Co.).

Synthesis of Compound (A)

The following compounds A-1 to A-10 were synthesized in accordance with the following procedure.

A-1: resin represented by the following formula (A-1)

A-2: resin having a structural unit represented by the following formula (A-2)

A-3: resin represented by the following formula (A-3)

A-4: resin having a structural unit represented by the following formula (A-4)

A-5: resin having a structural unit represented by the following formula (A-5)

A-6: compound represented by the following formula (A-6)

A-7: resin having a structural unit represented by the following formula (A-7)

A-8: compound represented by the following formula (A-8)

A-9: compound represented by the following formula (A-9)

A-10: compound represented by the following formula (A-10)

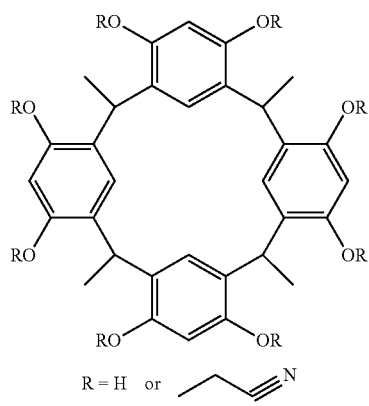

(A-1)

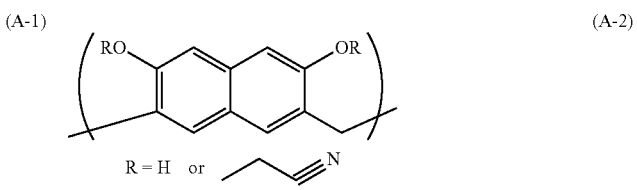

(A-2)

(A-3)
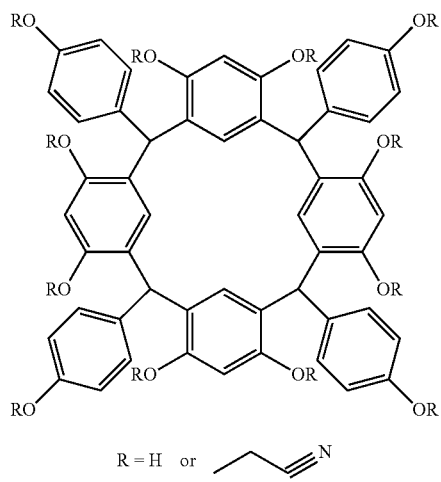
R = H or ⏤⏤C≡N
(A-4)
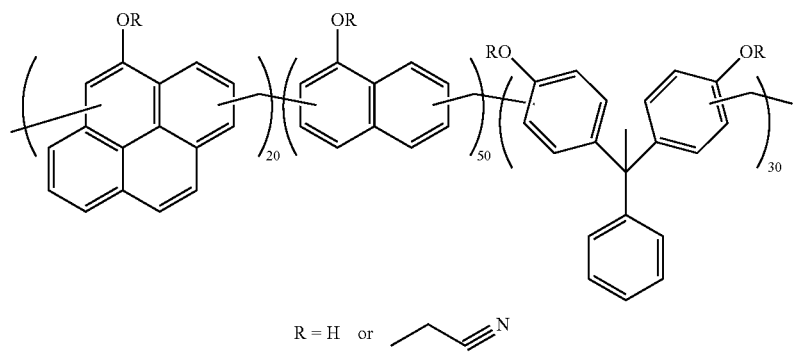
R = H or ⏤⏤C≡N
(A-5)
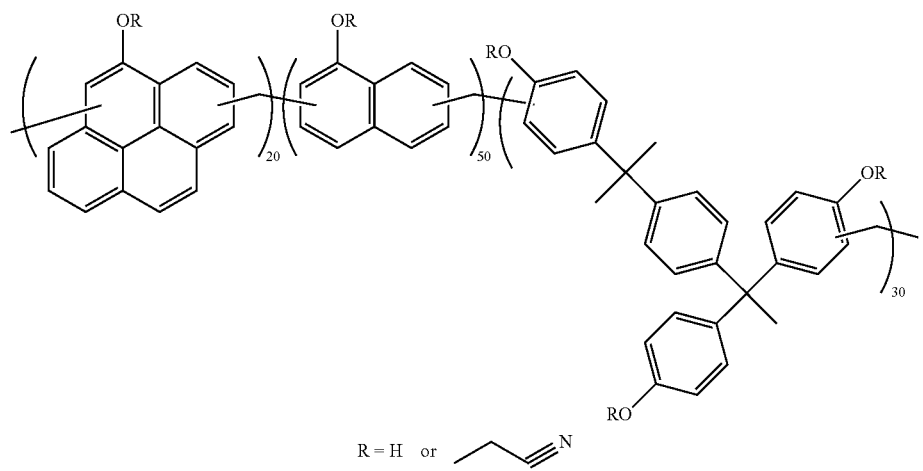
R = H or ⏤⏤C≡N -continued

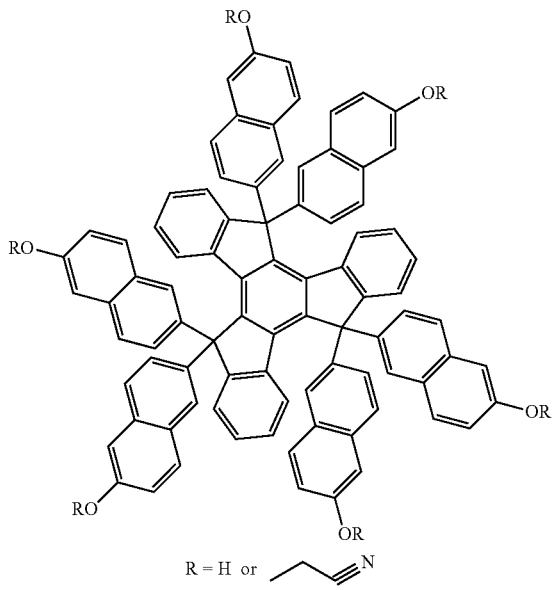
(A-6)

R = H or 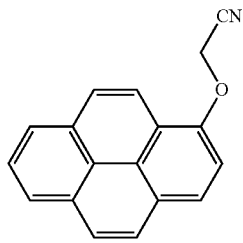

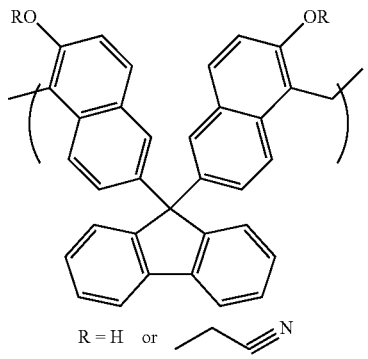
(A-7)

R = H or

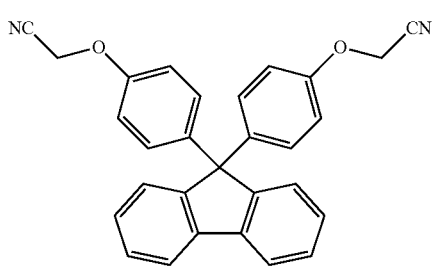
(A-8)

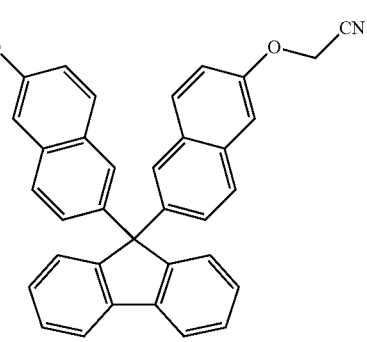
(A-9)

(A-10)

Synthesis Example 1

Into a 1,000 mL three-neck flask equipped with a thermometer, a condenser and a magnetic stirrer, 35 g of resorcinol, 28 g of ethanol, 11.8 g of concentrated hydrochloric acid and 35.4 g of water were charged in a nitrogen atmosphere, and dissolution was allowed at room temperature. The resulting solution was heated to 90° C. To the resulting solution thus heated, 20.5 g of paraldehyde was added dropwise over 15 min, and then a reaction was allowed to proceed for 6 hrs. After the completion of the reaction, the flask was cooled until the solution temperature reached room temperature. Thereafter, the solid precipitated was collected by filtration to remove the ethanol solution. Washing with a mixed solution of methanol and water (each 300 g) was carried out, followed by drying at 60° C. overnight under a reduced pressure, whereby 32.0 g of a precursor (a-1) including a phenolic hydroxyl group was obtained.

Next, into a 500 mL three-neck flask equipped with a thermometer, a condenser and a magnetic stirrer, 200 mL of N,N-dimethylacetamide, 20.3 g of potassium carbonate, and 10.0 g of the precursor (a-1) synthesized as above were charged in a nitrogen atmosphere, and the resulting mixture was stirred by the magnetic stirrer to allow dissolution to proceed. The resulting solution was heated to 80° C. To the resulting solution thus heated, 21.0 g of bromoacetonitrile was added dropwise over 30 min, and then a reaction was allowed to proceed for 6 hrs. After the completion of the reaction, the reaction solution was added to 2 L of water to which 14 mL of acetic acid was added. The supernatant liquid was removed, the residual highly viscous matter was dissolved in a minimum amount of acetone, and the solution was charged into 500 mL of water to permit reprecipitation. The highly viscous matter thus obtained was dried at 60° C. overnight under a reduced pressure, whereby 10.5 g of the compound (A-1) was obtained. The compound (A-1) obtained had the Mw of 850.

Synthesis Example 2

Into a 1,000 mL three-neck flask equipped with a thermometer, a condenser and a magnetic stirrer, 100 g of 2,7-dihydroxynaphthalene, 50.7 g of formaldehyde and 300 g of methyl isobutyl ketone were charged in a nitrogen atmosphere, and dissolution was allowed at room temperature. To the solution thus obtained, 3.58 g of p-toluenesulfonic acid monohydrate was charged at a solution temperature of 40° C., and the resulting solution was heated to 80° C. and aged for 11 hrs. After the aging, the flask was cooled until the solution temperature reached room temperature. The reaction solution was added to 5,000 mL of methanol, and the reddish-brown solid precipitated was collected by filtration to remove the methanol solution. Washing with a mixed solution of methanol and water (each 300 g) was carried out, followed by drying at 60° C. overnight under a reduced pressure, whereby 46.5 g of a precursor (a-2) was obtained. The precursor (a-2) obtained had the Mw of 1,500.

Next, into a 500 mL three-neck flask equipped with a thermometer, a condenser and a magnetic stirrer, 20.0 g of the precursor (a-2) synthesized as above, 34.5 g of bromoacetonitrile, 40.0 g of triethylamine and 200 g of tetrahydrofuran were charged in a nitrogen atmosphere, and a reaction was allowed to proceed at 50° C. for 12 hrs with stirring. After the completion of the reaction, the reaction solution was water-cooled to 30° C. or below. After being cooled, the reaction solution was added to 2,000 mL of n-heptane. The reddish-brown solid precipitated was collected by filtration to remove the n-heptane solution. Washing with 1,000 mL of n-heptane was carried out. Subsequently, the solid was dissolved in methyl isobutyl ketone, and the solution was sequentially washed with 1% by mass oxalic acid and pure water to remove the remaining triethylamine. Then, the organic layer thus obtained was concentrated, and the concentrated matter thus obtained was dried at 50° C. for 17 hrs, whereby the resin (A-2) was obtained. The resin (A-2) obtained had the Mw of 5,000.

Synthesis Example 3

Into a 1,000 mL three-neck eggplant-shaped flask, 35 g of resorcinol, 39 g of p-hydroxybenzaldehyde and 450 g of ethanol were charged, and dissolution was allowed at room temperature in a nitrogen atmosphere. To the solution thus obtained, 95.6 g of concentrated hydrochloric acid was added dropwise over 1 hr at a solution temperature of 40° C., and the resulting solution was heated to 80° C. and aged for 11 hrs. After the aging, the flask was cooled until the solution temperature reached room temperature. Thereafter, the reddish-brown solid precipitated was collected by filtration to remove the ethanol solution. Washing with a mixed solution of methanol and water (each 300 g) was carried out, followed by drying at 60° C. overnight under a reduced pressure, whereby 43.6 g of a precursor (a-3) including a phenolic hydroxyl group was obtained as a pink solid. Next, in a 500 mL round-bottom flask, 10.0 g of the precursor (a-3) synthesized as above was dissolved in 200 mL of N,N-dimethylacetamide in a nitrogen atmosphere, and the resulting mixture was stirred by the magnetic stirrer. To the solution thus obtained, 16.7 g of bromoacetonitrile was added with stirring, 19.4 g of potassium carbonate was further added, and the reaction was allowed to proceed at 80° C. for 18 hrs. After the completion of the reaction, the reaction solution was added to 2 L of water to which 14 mL of acetic acid had been added. The supernatant liquid was removed, the residual highly viscous matter was dissolved in a minimum amount of acetone, and the solution was charged into 500 mL of water to permit reprecipitation. The highly viscous matter thus obtained was dried at 65° C. overnight under a reduced pressure, whereby 12.5 g of the compound (A-3) was obtained as a brown solid. The compound (A-3) obtained had the Mw of 1,300.

Synthesis Example 4

Into a 300 mL three-neck flask equipped with a thermometer, a condenser and a magnetic stirrer, 41.79 g of 4,4-($\alpha$-methylbenzylidene)bisphenol, 17.82 g of 1-hydroxypyrene, 29.43 g of 1-naphthol and 10.97 g of paraformaldehyde were charged in a nitrogen atmosphere. Next, 0.703 g of p-toluenesulfonic acid monohydrate was dissolved in 145 g of propylene glycol monomethyl ether acetate, the resulting solution was charged into the three-neck flask, and polymerization was allowed to proceed with stirring at 95° C. for 6 hrs. After being cooled to room temperature, the reaction solution was charged into a large amount of a mixed solution of methanol and water (mass ratio: methanol/water=800/20), and the filtration followed by drying of the precipitated resin gave a precursor (a-4).

Into a 300 mL three-neck flask equipped with a thermometer, a condenser and a magnetic stirrer, 20 g of the precursor (a-4) synthesized as above, 80 g of N,N-dimethylacetamide and 8.38 g of potassium carbonate were charged in a nitrogen atmosphere. Next, the resulting solution was heated to 80° C. To the resulting solution thus heated, 14.55 g of bromoacetonitrile was added dropwise over 30 min, and then the resulting mixture was stirred for 6 hrs to allow the reaction to proceed. Then, 80 g of methyl isobutyl ketone and 80 g of water were added to the reaction liquid to carry out a liquid separating operation, and the organic layer thus obtained was charged into a large amount of methanol. The filtration followed by drying of the precipitated polymer at 60° C. overnight under a reduced pressure gave the resin (A-4). The resin (A-4) obtained had the Mw of 4,500.

Synthesis Example 5

Into a 300 mL three-neck flask equipped with a thermometer, a condenser and a magnetic stirrer, 43.34 g of 4-[4-[1,1-bis(4-hydroxyphenyl)ethyl]]-$\alpha$,$\alpha$-dimethybenzylphenol, 17.66 g of 1-hydroxypyrene, 29.17 g of 1-naphthol and 9.83 g of paraformaldehyde were charged. Next, 0.630 g of p-toluenesulfonic acid monohydrate was dissolved in 145 g of propylene glycol monomethyl ether acetate, the resulting solution was charged into the three-neck flask, and polymerization was allowed to proceed with stirring at 95° C. for 6 hrs. After being cooled to room temperature, the reaction solution was charged into a large amount of a mixed solution of methanol and water (mass ratio: methanol/water=800/20), and the filtration followed by drying of the precipitated resin gave a precursor (a-5).

Into a 300 mL three-neck flask equipped with a thermometer, a condenser and a magnetic stirrer, 20 g of the precursor (a-5) synthesized as above, 80 g of N,N-dimethylacetamide and 8.85 g of potassium carbonate were charged in a nitrogen atmosphere. Next, the resulting solution was heated to 80° C. To the resulting solution thus heated, 15.35 g of bromoacetonitrile was added dropwise over 30 min, and then the resulting mixture was stirred for 6 hrs to allow the reaction to proceed. Then, 80 g of methyl isobutyl ketone and 80 g of water were added to the reaction liquid to carry out a liquid separating operation, and the organic layer thus obtained was charged into a large amount of methanol. The filtration followed by drying of the precipitated resin at 60° C. overnight under a reduced pressure gave the resin (A-5). The resin (A-5) obtained had the Mw of 4,800.

Synthesis Example 6

To a 300 mL three-neck flask equipped with a thermometer, a condenser and a magnetic stirrer were charged 20 g of truxenone, 36 g of 2-naphthol, 1 g of β-mercaptopropionic acid and 150 g of toluene in a nitrogen atmosphere, and dissolution was allowed. Next, the resulting solution was heated to 50° C. To the resulting solution thus heated, 2.5 g of 98% by mass sulfuric acid was added dropwise over 15 min, and then the reaction was allowed to proceed for 10 hrs. To the reaction liquid, 100 g of toluene and 30 g of water were added, and a 10% by mass aqueous tetramethylammonium hydroxide solution was further added so that the pH of the reaction solution reached 7. Thereafter, the resulting solution was washed with water by liquid separation five times. The organic layer thus obtained was charged into a large amount of methanol, and the filtration followed by drying of the precipitated resin at 60° C. overnight under a reduced pressure gave a precursor (a-6).

Into a 300 mL three-neck flask equipped with a thermometer, a condenser and a magnetic stirrer, 20 g of the precursor (a-6) synthesized as above, 80 g of N,N-dimethylacetamide and 5.53 g of potassium carbonate were charged in a nitrogen atmosphere. Next, the resulting solution was heated to 80° C. To the resulting solution thus heated, 9.60 g of bromoacetonitrile was added dropwise over 30 min, and then the resulting mixture was stirred for 6 hrs to allow the reaction to proceed. Then, 80 g of methyl isobutyl ketone and 80 g of water were added to the reaction liquid to carry out a liquid separating operation, and the organic layer thus obtained was charged into a large amount of methanol. The filtration followed by drying of the precipitated resin at 60° C. overnight under a reduced pressure gave the resin (A-6).

Synthesis Example 7

Into a 300 mL three-neck flask equipped with a thermometer, a condenser and a magnetic stirrer, 38.59 g of 9,9-bis(hydroxynaphthyl)fluorene and 1.41 g of paraformaldehyde were charged in a nitrogen atmosphere. Next, 0.140 g of p-toluenesulfonic acid monohydrate was dissolved in 60 g of propylene glycol monomethyl ether acetate, the resulting solution was charged into the three-neck flask, and polymerization was allowed to proceed with stirring at 95° C. for 6 hrs. After being cooled to room temperature, the reaction solution was charged into a large amount of a mixed solution of methanol and water (mass ratio: methanol/water=800/20). The filtration followed by drying of the precipitated resin at 60° C. overnight under a reduced pressure gave a precursor (a-7).

Into a 300 mL three-neck flask equipped with a thermometer, a condenser and a magnetic stirrer, 20 g of the precursor (a-7) synthesized as above, 80 g of N,N-dimethylacetamide and 13.12 g of potassium carbonate were charged in a nitrogen atmosphere. Next, the resulting solution was heated to 80° C. To the resulting solution thus heated, 11.29 g of bromoacetonitrile was added dropwise over 30 min, and then the resulting mixture was stirred for 6 hrs to allow the reaction to proceed. After the reaction liquid was cooled to room temperature, 80 g of methyl isobutyl ketone and 80 g of water were added to the reaction liquid to carry out a liquid separating operation, and the organic layer thus obtained was charged into a large amount of methanol. The filtration followed by drying of the precipitated resin at 60° C. overnight under a reduced pressure gave the resin (A-7). The resin (A-7) obtained had the Mw of 5,000.

Synthesis Example 8

Into a 300 mL three-neck flask equipped with a thermometer, a condenser and a magnetic stirrer, 20 g of bisphenol fluorene (a-9), 80 g of N,N-dimethylacetamide and 7.90 g of potassium carbonate were charged in a nitrogen atmosphere. Next, the resulting solution was heated to 80° C. To the resulting solution thus heated, 13.71 g of bromoacetonitrile was added dropwise over 30 min, and then the resulting mixture was stirred for 6 hrs to allow the reaction to proceed. After the reaction liquid was cooled to room temperature, 80 g of methyl isobutyl ketone and 80 g of water were added to the reaction liquid to carry out a liquid separating operation, and the organic layer thus obtained was charged into a large amount of methanol. The filtration followed by drying of the precipitated compound at 60° C. overnight under a reduced pressure gave the compound (A-8).

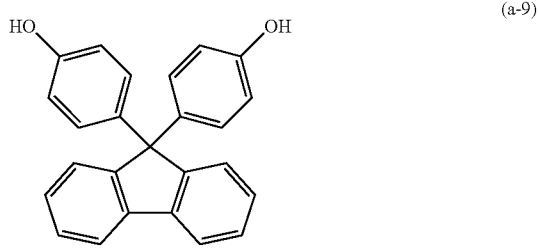 [SMILES: Oc1ccc(C2(c3ccc(O)cc3)c3ccccc3-c3ccccc32)cc1]

(a-9)

Synthesis Example 9

Into a 300 mL three-neck flask equipped with a thermometer, a condenser and a magnetic stirrer, 20 g of bisnaphthol fluorene (a-10), 80 g of N,N-dimethylacetamide and 6.14 g of potassium carbonate were charged in a nitrogen atmosphere. Next, the resulting solution was heated to 80° C. To the resulting solution thus heated, 10.66 g of bromoacetonitrile was added dropwise over 30 min, and then the resulting mixture was stirred for 6 hrs to allow the reaction to proceed. After the reaction liquid was cooled to room temperature, 80 g of methyl isobutyl ketone and 80 g of water were added to the reaction liquid to carry out a liquid separating operation, and the organic layer thus obtained was charged into a large amount of methanol. The filtration followed by drying of the precipitated compound at 60° C. overnight under a reduced pressure gave the compound (A-9).

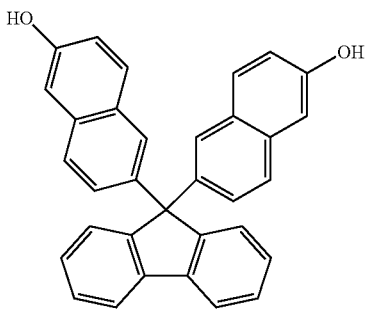

(a-10)

Synthesis Example 10

Into a 300 mL three-neck flask equipped with a thermometer, a condenser and a magnetic stirrer, 2.9 g of 1-hydroxypyrene, 80 g of N,N-dimethylacetamide and 6.28 g of potassium carbonate were charged in a nitrogen atmosphere. Next, the resulting solution was heated to 80° C. To the resulting solution thus heated, 10.90 g of bromoacetonitrile was added dropwise over 30 min, and then the resulting mixture was stirred for 6 hrs to allow the reaction to proceed. After the reaction liquid was cooled to room temperature, 80 g of methyl isobutyl ketone and 80 g of water were added to the reaction liquid to carry out a liquid separating operation, and the organic layer thus obtained was charged into a large amount of methanol. The filtration followed by drying of the precipitated compound at 60° C. overnight under a reduced pressure gave the compound (A-10).

Synthesis Example 11

Into a reaction vessel equipped with a condenser, a thermometer and a stirrer, 100 parts by mass of 2,7-dihydroxynaphthalene, 100 parts by mass of propylene glycol monomethyl ether acetate and 50 parts by mass of paraformaldehyde were charged, and then 2 parts by mass of oxalic acid was added to the resulting mixture. The resulting solution was heated to 120° C. while being dehydrated, and the reaction was allowed to proceed for 5 hrs, whereby the resin (a-8) having the structural unit represented by the following formula (a-8) was obtained. The resin (A-8) obtained had the Mw of 3,000.

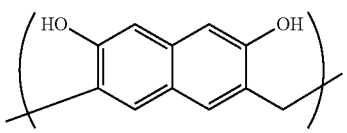

(a-8)

Preparation of Composition for Resist Underlayer Film Formation

Components used in addition to the compound (A) for the preparation of the composition for resist underlayer film formation are presented below.

(B) Solvent
B-1: propylene glycol monomethyl ether acetate
(C) Acid Generating Agent
C-1: bis(4-t-butylphenyl)iodonium nonafluoro-n-butanesulfonate (the compound represented by the following formula (C-1))

C-2: triethylammonium nonafluoro-n-butanesulfonate (the compound represented by the following formula (C-2))

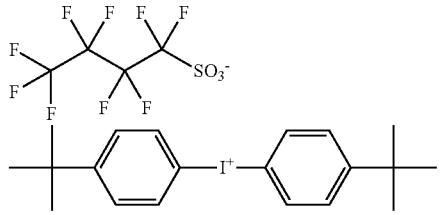

(C-1)

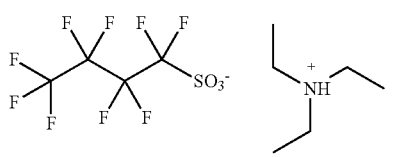

(C-2)

(D) Crosslinking Agent
D-1: 1,3,4,6-tetrakis(methoxymethyl)glycoluril (the compound represented by the following formula (D-1))
D-2: 4,4'-(1-(4-(1-(4-hydroxy-3,5-bis(methoxymethyl)phenyl)-1-methylethyl)phenyl)ethylidene)bis(2,6-bis(methoxymethyl)phenol (the compound represented by the following formula (D-2))

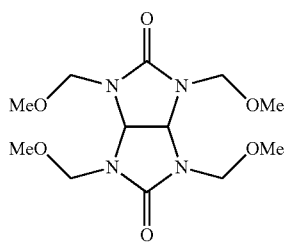

(D-1)

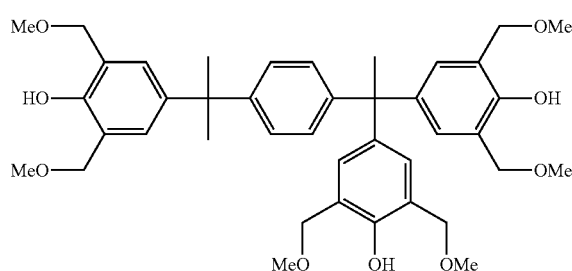

(D-2)

Example 1

(A-1) in an amount of 10 parts by mass as the compound (A) was dissolved in 100 parts by mass of (B-1) as the solvent (B). The resulting solution was filtered through a membrane filter having a pore size of 0.1 m, whereby a composition for resist underlayer film formation (J-1) was prepared.

Examples 2 to 20 and Comparative Examples 1 and 2

Each composition for resist underlayer film formation was prepared in a similar manner to Example 1 except that each component of the type and the amount shown in Table 1 below was used. In Table 1, "—" indicates that the relevant component was not used.

TABLE 1

| | Composition for resist underlayer film formation | Compound (A) | | Solvent (B) | | Acid generating agent (C) | | Crosslinking agent (D) | |
|---|---|---|---|---|---|---|---|---|---|
| | | type | content (parts by mass) | type | content (parts by mass) | type | content (parts by mass) | type | content (parts by mass) |
| Example 1 | J-1 | A-1 | 10 | B-1 | 100 | — | — | — | — |
| Example 2 | J-2 | A-2 | 10 | B-1 | 100 | — | — | — | — |
| Example 3 | J-3 | A-3 | 10 | B-1 | 100 | — | — | — | — |
| Example 4 | J-4 | A-4 | 10 | B-1 | 100 | — | — | — | — |
| Example 5 | J-5 | A-5 | 10 | B-1 | 100 | — | — | — | — |
| Example 6 | J-6 | A-6 | 10 | B-1 | 100 | — | — | — | — |
| Example 7 | J-7 | A-7 | 10 | B-1 | 100 | — | — | — | — |
| Example 8 | J-8 | A-2 | 10 | B-1 | 100 | C-1 | 0.5 | D-2 | 1 |
| Example 9 | J-9 | A-3 | 10 | B-1 | 100 | C-2 | 0.5 | D-1 | 1 |
| Example 10 | J-10 | A-6 | 10 | B-1 | 100 | C-1 | 0.5 | D-2 | 1 |
| Example 11 | J-11 | A-7 | 10 | B-1 | 100 | C-2 | 0.5 | D-1 | 1 |
| Example 12 | J-12 | A-1/A-2 | 8/2 | B-1 | 100 | — | — | — | — |
| Example 13 | J-13 | A-1/A-5 | 8/2 | B-1 | 100 | — | — | — | — |
| Example 14 | J-14 | A-3/A-4 | 8/2 | B-1 | 100 | — | — | — | — |
| Example 15 | J-15 | A-3/A-5 | 6/4 | B-1 | 100 | — | — | — | — |
| Example 16 | J-16 | A-6/A-4 | 6/4 | B-1 | 100 | — | — | — | — |
| Example 17 | J-17 | A-7/A-5 | 6/4 | B-1 | 100 | — | — | — | — |
| Example 18 | J-19 | A-8 | 10 | B-1 | 100 | — | — | — | — |
| Example 19 | J-20 | A-9 | 10 | B-1 | 100 | — | — | — | — |
| Example 20 | J-21 | A-10 | 10 | B-1 | 100 | — | — | — | — |
| Comparative Example 1 | J-18 | a-8 | 10 | B-1 | 100 | — | — | — | — |
| Comparative Example 2 | J-22 | a-9 | 10 | B-1 | 100 | — | — | — | — |

Formation of Resist Underlayer Film

Examples 21 to 40 and Comparative Examples 3 and 4

The compositions for resist underlayer film formation prepared as described above were applied on silicon wafer substrates by a spin-coating process. Thereafter, heating (baking) was carried out at 250° C. for 60 sec in an ambient air atmosphere to form a resist underlayer film having an average thickness of 200 nm, whereby substrates each having a resist underlayer film formed thereon (Examples 21 to 31 and 38 to 40 and Comparative Examples 3 and 4) were obtained. In Examples 32 to 37, heating (baking) was carried out at 400° C. for 60 sec, whereby substrates each having a resist underlayer film formed thereon were obtained.

Evaluations

The compositions for resist underlayer film formation obtained as described above or the substrates having the resist underlayer film obtained as described above were evaluated for the following properties in accordance with the following procedure. The results of the evaluations are shown in Table 2.

Solvent Resistance

The substrates each having the resist underlayer film formed thereon obtained as described above were immersed in cyclohexanone at 20 to 25° C. for 1 min. The average film thickness was determined before and after the immersion. The absolute value of $(X-X_0) \times 100/X_0$ was calculated, wherein $X_0$ denotes the average film thickness measured before the immersion, and $X$ denotes the average film thickness measured after the immersion. The calculated value was defined as rate (%) of change in the film thickness. The solvent resistance was evaluated to be: "A (favorable)" in a case where the rate of change in the film thickness was less than 1%; "B (somewhat favorable)" in a case where the rate of change in the film thickness was no less than 1% and less than 5%; and "C (unfavorable)" in a case where the rate of change in the film thickness was no less than 5%.

Etching Resistance

The resist underlayer film on the substrate having the resist underlayer film formed thereon obtained as described above was treated by using an etching apparatus ("TAC-TRAS", available from Tokyo Electron Limited) under conditions involving $CF_4/Ar=110/440$ sccm, PRESS.=30 MT, HF RF=500 W, LF RF=3,000 W, DCS=−150 V, RDC=50%, for 30 sec. The etching rate (nm/min) was calculated from the average film thicknesses measured before and after the treatment, then the ratio of the etching rate of the film according to Examples with respect to that of the film according to Comparative Example 3 was calculated, and the calculated value was used as an index for determining the etching resistance. The etching resistance was evaluated to be: "A (extremely favorable)" in a case where the ratio was no less than 0.95 and less than 0.98; "B (favorable)" in a case where the ratio was no less than 0.98 and less than 1.00; and "C (unfavorable)" in a case where the ratio was no less than 1.00. It is to be noted that in Table 2, "-" in the column of "Etching resistance" for Comparative Example 3 indicates a standard for the evaluation, and "-" in the column of "Etching resistance" for Comparative Example 4 indicates that the evaluation was not made.

Flatness

Each of the compositions for resist underlayer film formation prepared as described above was applied on a stepped $SiO_2$ substrate on which: trenches having a width of 42 nm, a pitch of 84 nm and a depth of 180 nm (aspect ratio: 4.3); trenches having a width of 100 nm, a pitch of 150 nm and a depth of 180 nm (aspect ratio: 1.8); and trenches having a width of 5 m and a depth of 180 nm (aspect ratio: 0.036) were provided in combination (the ratio of the maximum value to the minimum value of the aspect ratios differing from each other: 119). Thereafter, baking was carried out in an ambient air atmosphere to form a resist underlayer film having a thickness of 200 nm. The shape of the resist underlayer film was observed using a scanning electron microscope ("S-4800" available from Hitachi High-Technologies Corporation), and the difference between the maximum value and the minimum value of the average thickness of the resist underlayer film on the trenches or spaces (ΔFT) was determined. The flatness was evaluated to be: "A (extremely favorable)" in a case where the ΔFT was less than 10 nm; "B (favorable)" in a case where the ΔFT was no less than 10 nm and less than 20 nm; "C (somewhat favorable)" in a case where the ΔFT was no less than 20 nm and less than 35 nm, and "D (unfavorable)" in a case where the ΔFT was no less than 35.

Heat Resistance

The composition for resist underlayer film formation prepared as described above was applied on a silicon wafer having a diameter of 8 inches by a spin-coating process, whereby a resist underlayer film having a resist underlayer film formed thereon was obtained. From the substrate having the resist underlayer film formed thereon, the resist underlayer film was scraped off and recovered in the form of powder. The powder was placed in a vessel, and the mass of the powder was measured. Next, by using a TG-DTA apparatus ("TG-DTA2000SR" available from NETZSCH), the powder was heated to 400° C. at a rate of 10° C./min in a nitrogen atmosphere, and the mass of the powder at 400° C. was measured. Then, the mass reduction rate (%) was determined according to the following equation, and the determined mass reduction rate was used as an index for determining the heat resistance.

$$ML=\{(m1-m2)/m1\}\times 100$$

In the above equation, ML denotes the mass reduction rate (%), m1 denotes the mass (mg) measured before the heating, and m2 denotes the mass (mg) measured at 400° C.

The smaller mass reduction rate indicates that a smaller amount of sublimated matter and resist under layer film degradation products is generated during the heating of the resist underlayer film and thus the heat resistance is more favorable. In other words, the smaller mass reduction rate indicates superior heat resistance. The heat resistance was evaluated to be: "A (extremely favorable)" in a case where the mass reduction rate was no less than 0% and less than 5%; "B (favorable)" in a case where the mass reduction rate was no less than 5% and less than 10%; and "C (unfavorable)" in a case where the mass reduction rate was no less than 10%.

Storage Stability

The composition for resist underlayer film formation obtained as described above was stored at 23° C., and the Mw of the compound (A) contained after a lapse of 3 months was measured to evaluate the storage stability. By comparisons made between the Mw measured immediately after the preparation and the Mw measured after the lapse of 3 months, the storage stability was evaluated to be: "A (favorable)" in a case where a rate of change in the Mw was less than 5%; and "B (unfavorable)" in a case where a rate of change in the Mw was no less than 5%.

TABLE 2

| | Composition for resist underlayer film formation | Heating temperature/ heating time during formation of resist underlayer formation (° C./sec) | Solvent resistance | Etching resistance | Flatness | Heat resistance | Storage stability |
|---|---|---|---|---|---|---|---|
| Example 21 | J-1 | 250/60 | B | B | A | B | A |
| Example 22 | J-2 | 250/60 | A | B | A | B | A |
| Example 23 | J-3 | 250/60 | B | B | B | A | A |
| Example 24 | J-4 | 250/60 | A | A | B | A | A |
| Example 25 | J-5 | 250/60 | A | A | B | A | A |
| Example 26 | J-6 | 250/60 | B | B | A | B | A |
| Example 27 | J-7 | 250/60 | A | B | A | A | A |
| Example 28 | J-8 | 250/60 | A | B | B | A | A |
| Example 29 | J-9 | 250/60 | A | B | B | A | A |
| Example 30 | J-10 | 250/60 | A | B | B | A | A |
| Example 31 | J-11 | 250/60 | A | B | B | A | A |
| Example 32 | J-12 | 400/60 | A | B | A | B | A |
| Example 33 | J-13 | 400/60 | A | B | A | A | A |
| Example 34 | J-14 | 400/60 | A | A | A | A | A |
| Example 35 | J-15 | 400/60 | A | A | A | A | A |
| Example 36 | J-16 | 400/60 | A | A | A | A | A |
| Example 37 | J-17 | 400/60 | A | A | A | A | A |
| Example 38 | J-19 | 250/60 | A | B | A | A | A |
| Example 39 | J-20 | 250/60 | A | B | A | A | A |
| Example 40 | J-21 | 250/60 | A | A | A | A | A |
| Comparative Example 3 | J-18 | 250/60 | C | — | C | C | A |
| Comparative Example 4 | J-22 | 250/60 | C | — | B | C | A |

The results shown in Table 2 indicate that the composition for resist underlayer film formation according to the embodiment of the present invention enabled the formation of a resist underlayer film superior in flatness, as well as in solvent resistance, etching resistance and heat resistance, and that the composition was superior in storage stability.

The composition for resist underlayer film formation according to the embodiment of the present invention enables the formation of a resist underlayer film superior in flatness as well as in solvent resistance, etching resistance and heat resistance. Also, the composition for resist underlayer film formation is superior in storage stability. The resist underlayer film according to the another embodiment of the present invention is superior in flatness, as well as in solvent resistance, etching resistance and heat resistance. The method for producing a patterned substrate according to the still another embodiment of the present invention enables the formation of a patterned substrate having a superior pattern configuration through the use of the formed resist underlayer film having superior characteristics. Therefore, these can be suitably used for the manufacture of semiconductor devices and the like in which further progress of miniaturization is expected in the future.

Obviously, numerous modifications and variations of the present invention are possible in light of the above teachings. It is therefore to be understood that within the scope of the appended claims, the invention may be practiced otherwise than as specifically described herein.

What is claimed is:

1. A method for producing a patterned substrate, comprising:
forming a resist underlayer film from a composition directly or indirectly on an upper face side of a substrate;
forming a resist pattern directly or indirectly on an upper face side of the resist underlayer film; and
forming a pattern on the substrate by etching the substrate a plurality of times using the resist pattern as a mask,
wherein the composition includes a solvent, and a compound including a group of formula (1),

*—$R^1$—$R^2$—CN     (1)

where $R^1$ is a single bond or an oxygen atom, $R^2$ is a divalent chain or alicyclic hydrocarbon group having 1 to 30 carbon atoms, and * is a bonding site directly bonding to an aromatic ring in the compound, and the compound is selected from the group consisting of a novolac resin, a resol resin, an aromatic ring-containing vinyl resin, an acenaphthylene resin, an indene resin, a polyarylene resin, a triazine resin, a pyrene resin, a calixarene resin, an aromatic ring-containing compound having a molecular weight of no less than 200 and no greater than 3,000, and a combination thereof.

2. The method of claim 1, wherein the group is one of a cyanomethyl group, a cyanoethyl group, a cyanopropyl group, a cyanobutyl group, a cyanopentyl group, a cyanohexyl group, a cyanooctyl group, a cyanodecyl group, a cyanomethyloxy group, a cyanoethyloxy group, a cyanopropyloxy group, a cyanobutyloxy group, a cyanopentyloxy group, a cyanohexyloxy group, a cyanooctyloxy group, and a cyanodecyloxy group.

3. The method of claim 1, wherein the compound is a novolac resin, a resol resin, or a combination thereof.

4. The method of claim 1, wherein the compound includes an aromatic ring at a proportion of 20% by mass or more.

5. The method of claim 1, wherein the compound includes an aromatic ring at a proportion of 30% by mass or more.

6. The method of claim 1, wherein the compound includes an aromatic ring at a proportion of 40% by mass or more.

7. The method of claim 4, wherein the group is one of a cyanomethyl group, a cyanoethyl group, a cyanomethyloxy group, and a cyanoethyloxy group.

8. The method of claim 1, wherein the compound includes at least one polycondensation resin.

9. The method of claim 1, wherein the compound is at least one polycondensation resin.

10. The method of claim 2, wherein the compound includes an aromatic ring at a proportion of 20% by mass or more.

11. The method of claim 2, wherein the compound includes an aromatic ring at a proportion of 30% by mass or more.

12. The method of claim 2, wherein the compound includes an aromatic ring at a proportion of 40% by mass or more.

13. The method of claim 1, wherein the compound is an aromatic ring-containing vinyl resin, an acenaphthylene resin, an indene resin, a polyarylene resin, a triazine resin, a pyrene resin, a calixarene resin or a combination thereof.

14. The method of claim 1, wherein the group is one of a cyanomethyloxy group and a cyanoethyloxy group.

15. The method of claim 4, wherein the group is one of a cyanomethyloxy group and a cyanoethyloxy group.

16. The method of claim 3, wherein the compound includes an aromatic ring at a proportion of 20% by mass or more.

17. The method of claim 8, wherein the compound includes an aromatic ring at a proportion of 20% by mass or more.

18. The method of claim 9, wherein the compound includes an aromatic ring at a proportion of 20% by mass or more.

19. The method of claim 13, wherein the compound includes an aromatic ring at a proportion of 20% by mass or more.

20. The method of claim 14, wherein the compound includes an aromatic ring at a proportion of 20% by mass or more.